(12) United States Patent
Choi et al.

(10) Patent No.: US 12,394,343 B2
(45) Date of Patent: Aug. 19, 2025

(54) DISPLAY DEVICE

(71) Applicant: LG Display Co., Ltd., Seoul (KR)

(72) Inventors: Jaekyung Choi, Goyang-si (KR); Junhyuk Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 18/399,338

(22) Filed: Dec. 28, 2023

(65) Prior Publication Data
US 2024/0221562 A1 Jul. 4, 2024

(30) Foreign Application Priority Data

Dec. 30, 2022 (KR) .......................... 10-2022-0190465

(51) Int. Cl.
| | |
|---|---|
| *G09G 3/00* | (2006.01) |
| *G09G 3/32* | (2016.01) |
| *H01L 27/15* | (2006.01) |
| *H10H 29/14* | (2025.01) |

(52) U.S. Cl.
CPC ............... *G09G 3/035* (2020.08); *G09G 3/32* (2013.01); *H10H 29/142* (2025.01); *G09G 2300/0426* (2013.01); *G09G 2330/021* (2013.01)

(58) Field of Classification Search
CPC .. G09G 3/035; G09G 3/32; G09G 2300/0426; G09G 2330/021; H10H 29/142
See application file for complete search history.

(56) References Cited

U.S. PATENT DOCUMENTS

| | | | |
|---|---|---|---|
| 11,538,851 | B2 | 12/2022 | Choi et al. |
| 11,552,152 | B2* | 1/2023 | Shim .................. H10K 50/8426 |
| 2019/0288234 | A1* | 9/2019 | Kim ..................... H10K 50/844 |
| 2022/0352252 | A1 | 11/2022 | Lee et al. |

FOREIGN PATENT DOCUMENTS

| | | | | |
|---|---|---|---|---|
| KR | 20200017336 | A | * 2/2020 | ......... H01L 27/3213 |
| KR | 20200137059 | A | 12/2020 | |
| TW | 202221922 | A | 6/2022 | |
| TW | I767615 | B | 6/2022 | |

OTHER PUBLICATIONS

Translation of KR-20200017336-A (Year: 2020).*

* cited by examiner

*Primary Examiner* — Lixi C Simpson
(74) *Attorney, Agent, or Firm* — Seed IP Law Group LLP

(57) ABSTRACT

According to an aspect of the present disclosure, a display device includes a lower substrate which is divided into an active area and a non-active area and is stretchable; a plurality of pixels which is disposed on the active area of the lower substrate; a power supply which is disposed on the non-active area of the lower substrate; a plurality of lower connection lines which is disposed on the lower substrate and is connected to each of the plurality of pixels; an upper substrate which is opposite to the lower substrate and is stretchable; a plurality of conductive patterns which is disposed below the upper substrate and is connected to the plurality of pixels, respectively; and a plurality of upper connection lines which is disposed below the upper substrate and is connected to the plurality of conductive patterns. The power supply is electrically connected to the plurality of pixels through a part of the plurality of upper connection lines and a part of the plurality of lower connection lines, to stably supply a voltage to the plurality of pixels.

19 Claims, 11 Drawing Sheets

DISPLAY DEVICE

CROSS-REFERENCE TO RELATED APPLICATIONS

This application claims the priority of Korean Patent Application No. 10-2022-0190465 filed on Dec. 30, 2022, in the Korean Intellectual Property Office, the disclosure of which is incorporated herein by reference.

BACKGROUND

Technical Field

The present disclosure relates to a stretchable display device.

Description of the Related Art

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Recently, a display device is manufactured by forming a display unit and a wiring line on a flexible substrate such as plastic which is a flexible material so as to be stretchable in a specific direction and changed in various forms is getting attention as a next generation display device.

BRIEF SUMMARY

An object to be achieved by the present disclosure is to provide a display device which is stretchable and includes a vertical LED.

Another object to be achieved by the present disclosure is to provide a display device which may reduce or minimize dropping of a driving voltage.

Still another object to be achieved by the present disclosure is to provide a display device which is capable of reducing a number of connection lines of the lower substrate.

Objects of the present disclosure are not limited to the above-mentioned objects, and other objects, which are not mentioned above, can be clearly understood by those skilled in the art from the following descriptions.

According to an aspect of the present disclosure, a display device includes a lower substrate has an active area and a non-active area and is stretchable; a plurality of pixels disposed on the active area of the lower substrate; a power supply disposed on the non-active area of the lower substrate; a plurality of lower connection lines disposed on the lower substrate and connected to each of the plurality of pixels; an upper substrate which is spaced from the lower substrate and is stretchable; a plurality of conductive patterns disposed below the upper substrate and preferably between the upper and lower substrates. The conductive patterns are connected to the plurality of pixels, respectively. There are a plurality of upper connection lines disposed below the upper substrate and connected to the plurality of conductive patterns. The power supply is electrically connected to the plurality of pixels through at least one of the plurality of upper connection lines and at least one of the plurality of lower connection lines, to stably supply a voltage to the plurality of pixels.

According to the present disclosure, a stable low potential voltage is supplied to the light emitting diode so that a luminous efficiency and a stability of the light emitting diode may be ensured and the low power driving may be enabled.

Other detailed matters of the exemplary embodiments are included in the detailed description and the drawings.

According to the present disclosure, a number of connection lines on the lower substrate of the display device is reduced so that a stretching rate of the display device may be improved.

According to the present disclosure, in the display device, a resistance of a conductive pattern which transmits a gate voltage is reduced which will also reduce the delay of the gate voltage.

In the display device of the present disclosure, it is advantageous in that the number of pixels is increased so that the resolution is also improved.

In the display device of the present disclosure, it is advantageous in that a manufacturing yield of a light emitting diode of the display device of the present disclosure is improved.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1A:
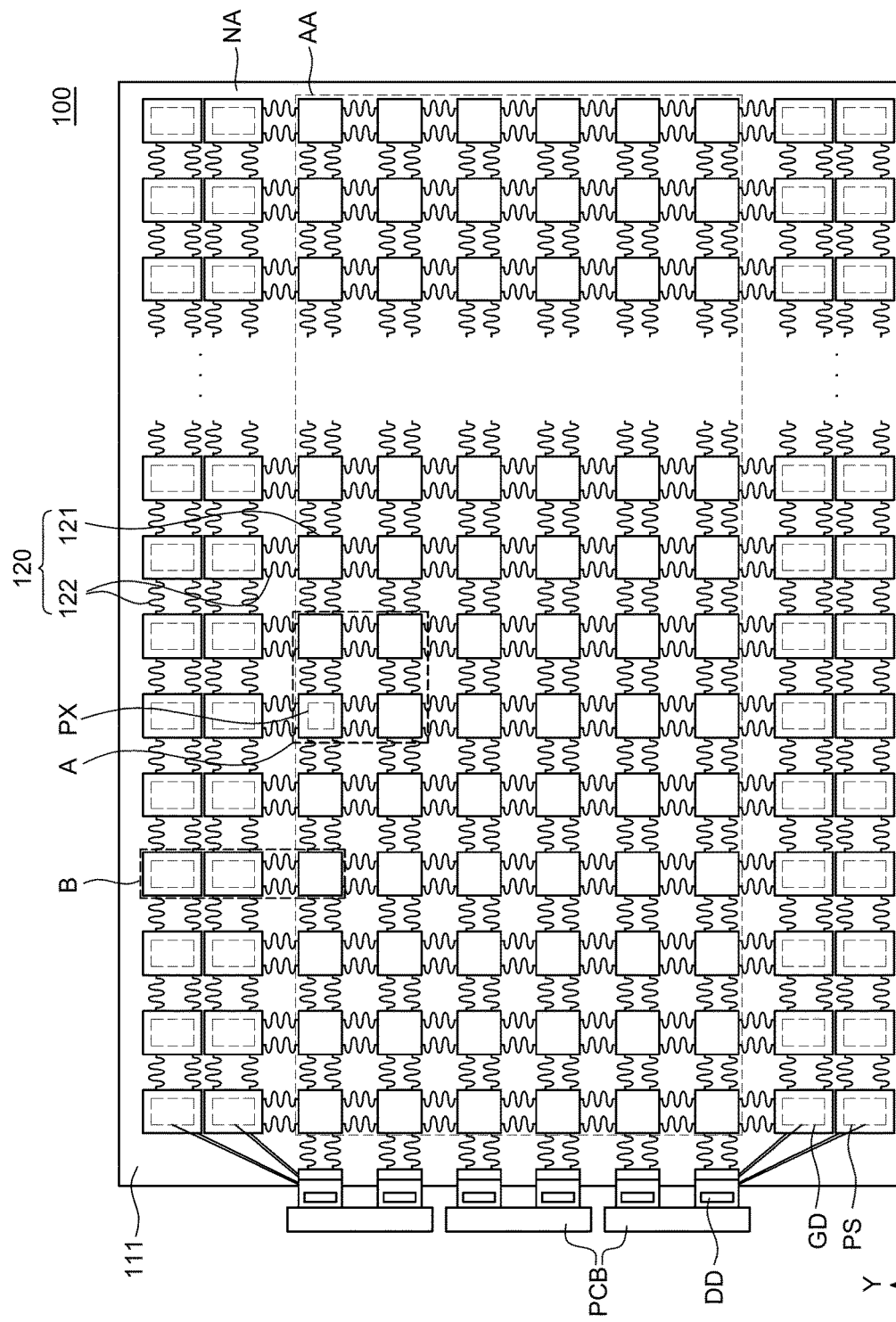
FIGS. 1A and 1B are plan views illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Hereinafter, various exemplary embodiments of the present disclosure will be described in detail with reference to accompanying drawings.

A display device according to an exemplary embodiment of the present disclosure is a display device which is capable of displaying images even in a bent or extended state and may also be referred to as a stretchable display device, a flexible display device and an extendable display device. As compared with the general display devices of the related art, the display device has not only a high flexibility, but also stretchability. Therefore, the user may bend or extend a display device and a shape of a display device may be freely changed in accordance with manipulation of a user. For example, when the user pulls the display device by holding ends of the display device, the display device may be extended to the pulling direction of the user. Alternatively, when the user disposes the display device on an outer surface which is not flat, the display device may be disposed to be bent in accordance with the shape of the outer surface of the wall. Further, when a force applied by the user is removed, the display device may return to its original shape.

Stretchable Substrate and Pattern Layer

Figure 1B:
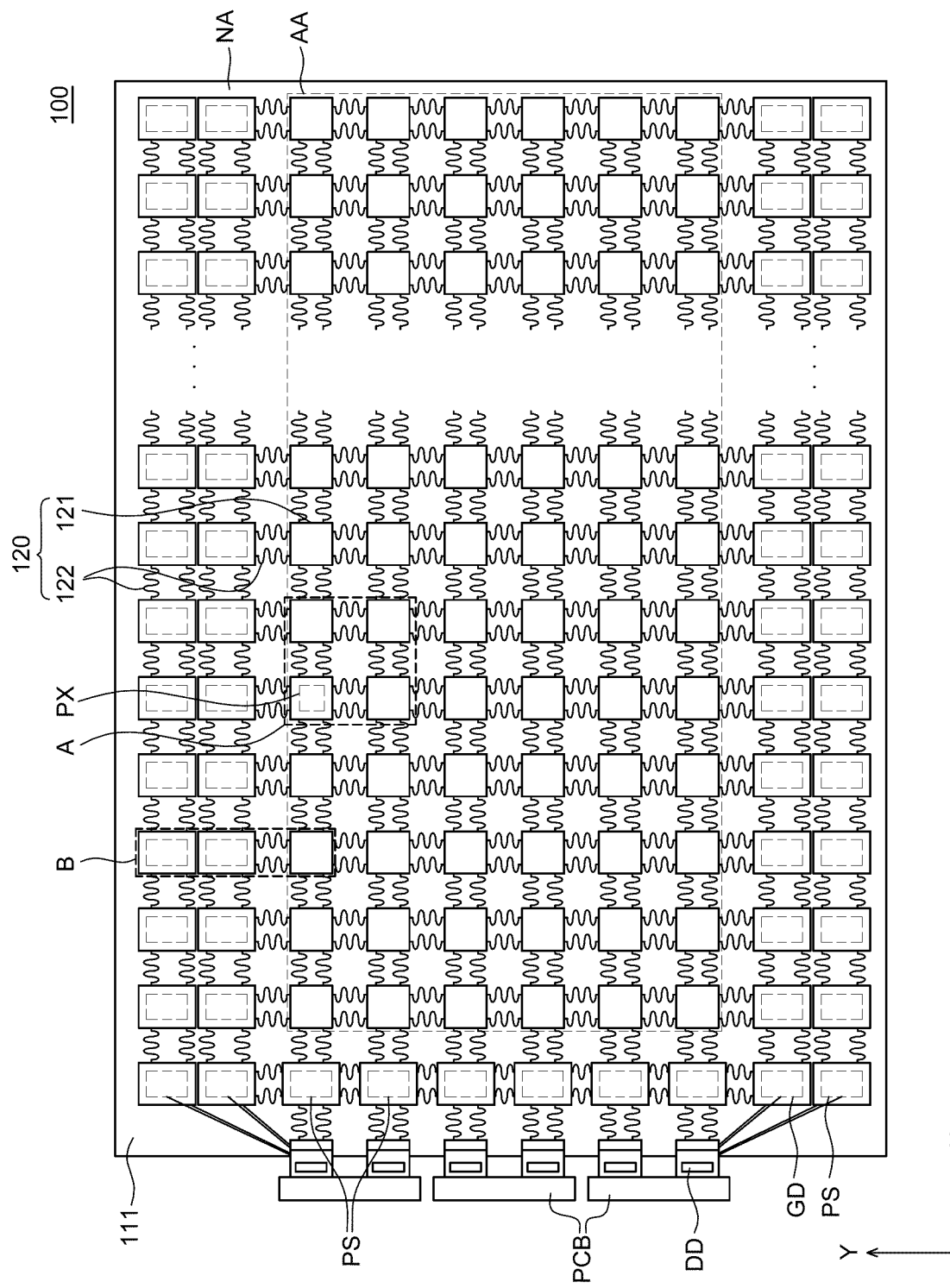

FIGS. 1A and 1B are plan views illustrating a display device according to an exemplary embodiment of the present disclosure.

Figure 2:
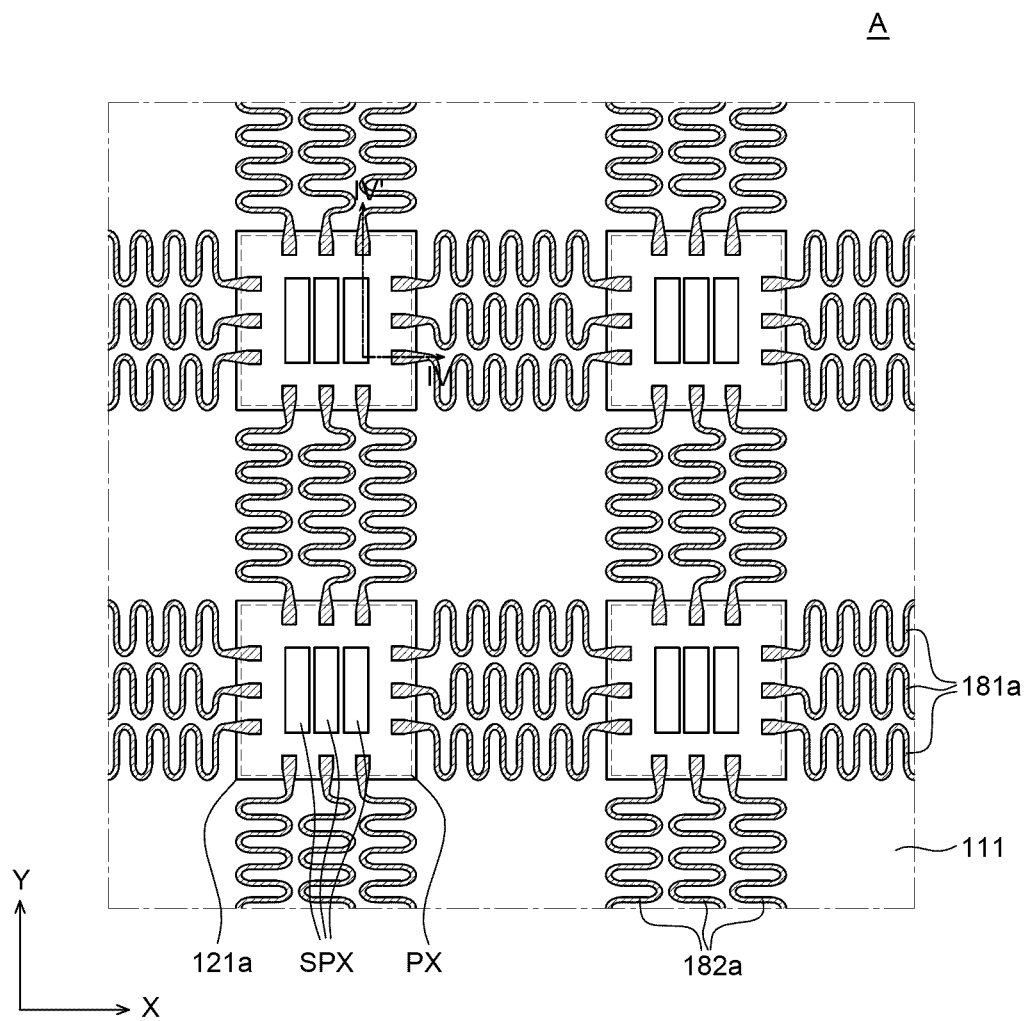
FIG. 2 is an enlarged plan view of a lower substrate disposed in an active area of a display device according to an exemplary embodiment of the present disclosure.

FIG. 2 is an enlarged plan view of a lower substrate disposed in an active area of a display device according to an exemplary embodiment of the present disclosure.

Figure 3:
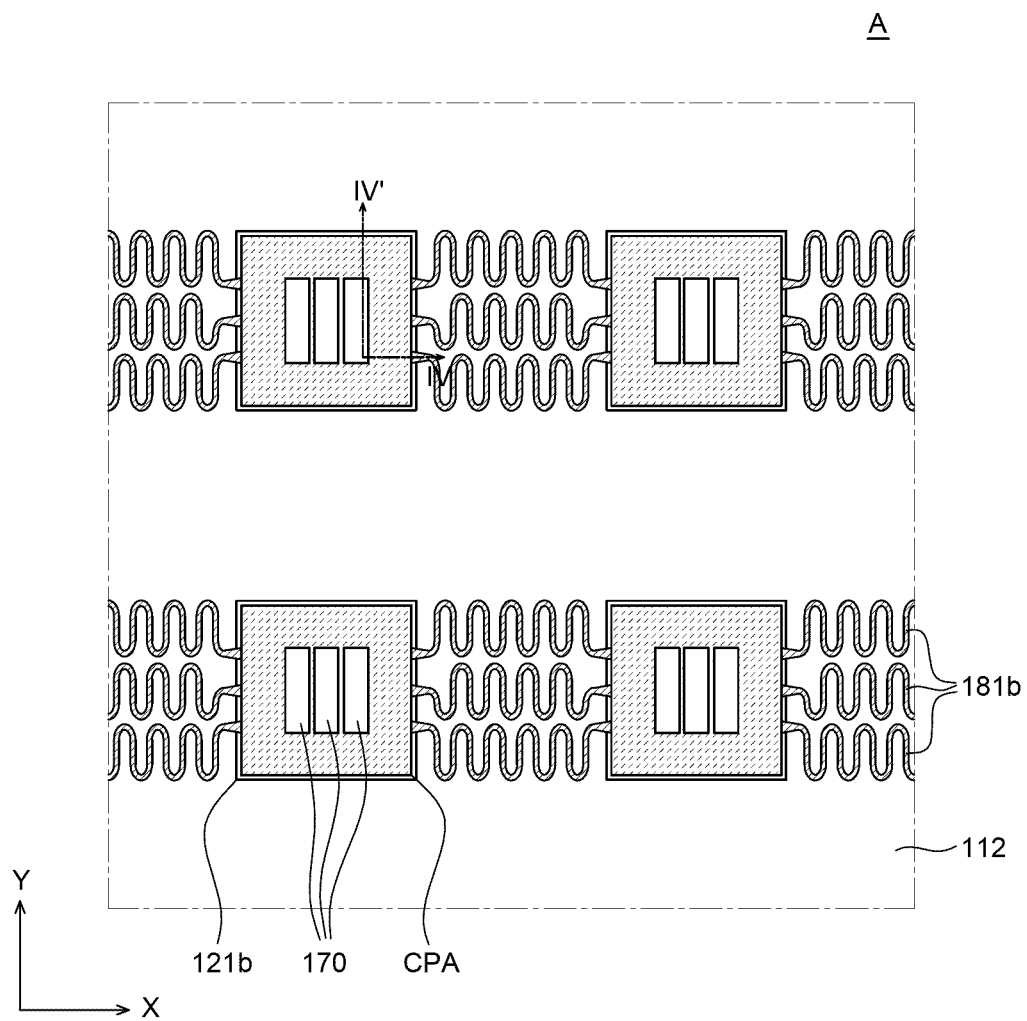
FIG. 3 is an enlarged plan view of an upper substrate disposed in an active area of a display device according to an exemplary embodiment of the present disclosure.

FIG. 3 is an enlarged plan view of an upper substrate disposed in an active area of a display device according to an exemplary embodiment of the present disclosure.

Figure 4:
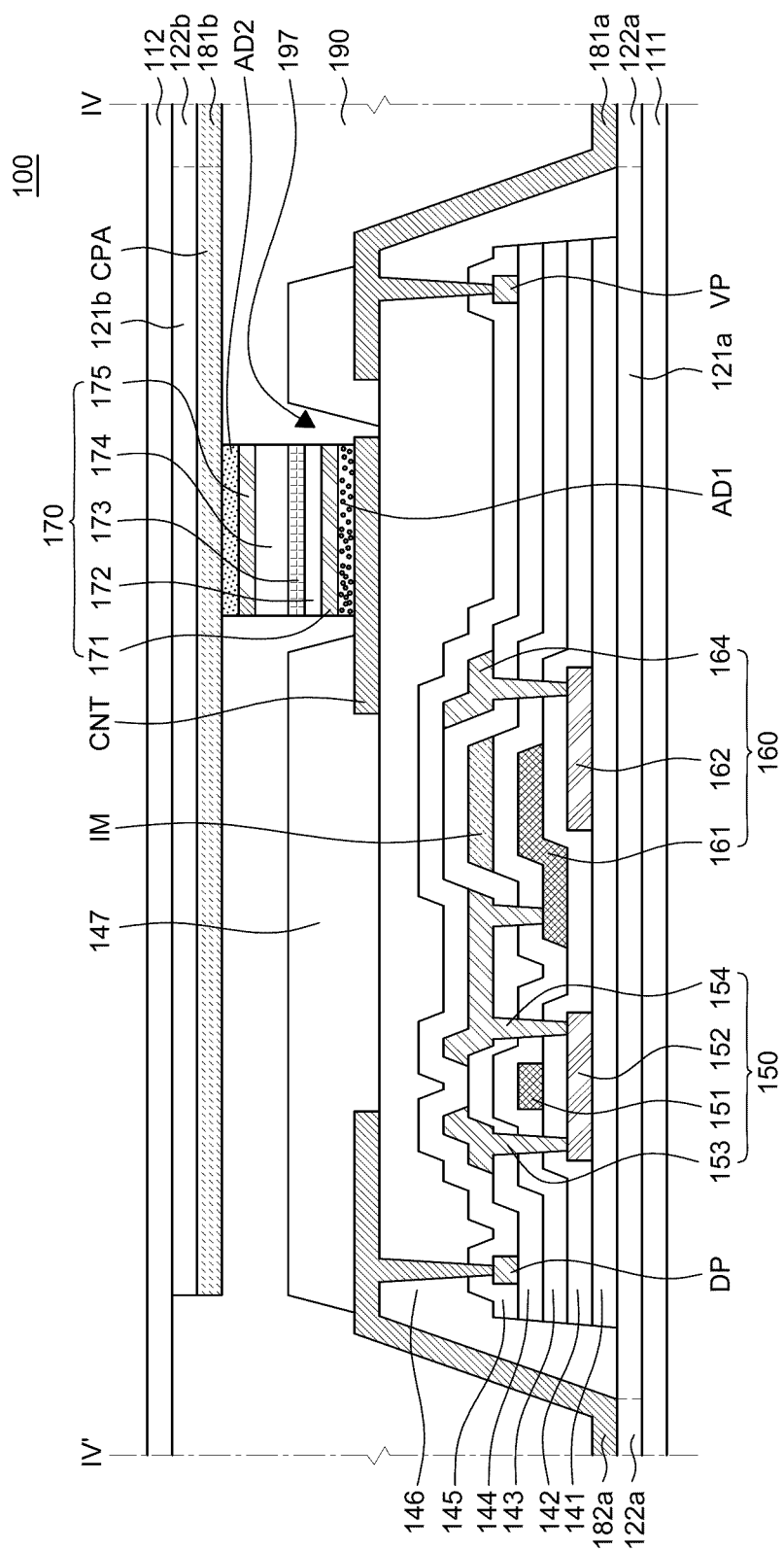
FIG. 4 is a cross-sectional view taken along the line IV-IV' of FIGS. 2 and 3.

FIG. 4 is a cross-sectional view taken along the line IV-IV' of FIGS. 2 and 3.

For the convenience of description, FIGS. 1A and 1B illustrate components other than the upper substrate 112. Further, in FIG. 2, a lower substrate 111 and components disposed on the lower substrate 111 in an area A illustrated in FIGS. 1A and 1B are illustrated. Further, in FIG. 3, an upper substrate 112 and components disposed on the upper substrate 112 in an area A illustrated in FIGS. 1A and 1B are illustrated.

Referring to FIGS. 1A and 1B, a display device 100 according to an exemplary embodiment of the present disclosure includes a lower substrate 111, a pattern layer 120, a plurality of pixels PX, a gate driver GD, a data driver DD, and a power supply PS. In the exemplary embodiment, further referring to FIG. 4, the display device 100 may further include a filling layer 190 and an upper substrate 112.

The lower substrate 111 is a substrate which supports and protects several components of the display device 100. The upper substrate 112 is a substrate which covers and protects several components of the display device 100. That is, the lower substrate 111 is a substrate which supports the pattern layer 120 on which the pixels PX, the gate driver GD, and the power supply PS are formed. The upper substrate 112 is a substrate which covers the pixels PX, the gate driver GD, and the power supply PS.

The lower substrate 111 and the upper substrate 112 which are flexible substrates may include an insulating material which is bendable or extendable. For example, the lower substrate 111 and the upper substrate 112 may be formed of a silicon rubber such as polydimethylsiloxane (PDMS) or an elastomer such as polyurethane (PU) or polytetrafluoroethylene (PTFE). Accordingly, each of the lower substrate 111 and the upper substrate 112 may have flexibility. Depending on the exemplary embodiment, the materials of the lower substrate 111 and the upper substrate 112 may be the same, but are not limited thereto and may vary.

The lower substrate 111 and the upper substrate 112, respectively, are ductile substrates so as to be reversibly expandable and contractible. Accordingly, the lower substrate 111 may also be referred to as a lower stretchable substrate, a lower stretching substrate, a lower extending substrate, a lower ductile substrate, a lower flexible substrate, a first stretchable substrate, a first stretching substrate, a first extending substrate, a first ductile substrate, or a first flexible substrate. The upper substrate 112 may also be referred to as an upper stretchable substrate, an upper stretching substrate, an upper extending substrate, an upper ductile substrate, an upper flexible substrate, a second stretchable substrate, a second stretching substrate, a second extending substrate, a second ductile substrate, or a second flexible substrate. Further, the modulus of elasticity of each of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a timing when an object to be stretched is broken or cracked. A thickness of the lower substrate 111 may be 10 um to 1 mm, but is not limited thereto.

The lower substrate 111 may include an active area AA and a non-active area NA which encloses the active area AA. However, the active area AA and the non-active area NA are not limited only to the lower substrate 111, but may be for the entire display device 100.

The active area AA may be an area in which images are displayed in the display device 100. A plurality of pixels PX may be disposed on the active area AA. Each pixel PX may include a display element and various driving elements for driving the display element. Various driving elements may refer to at least one thin film transistor (TFT) and a capacitor, but are not limited thereto. The plurality of pixels PX may be connected to various wiring lines, respectively. For example, each of the plurality of pixels PX may be connected to various wiring lines, such as a gate line, a data line, a high potential voltage line, a low potential voltage line, a reference voltage line, and an initialization voltage line.

The non-active area NA may be an area where no image is displayed. The non-active area NA may be disposed to be adjacent to the active area AA. For example, the non-active area NA may be an area which encloses the active area AA. However, it is not limited thereto so that the non-active area NA corresponds to an area excluding the active area AA from the lower substrate 111 and may be modified and separated in various forms. Components for driving a plurality of pixels PX disposed in the active area AA may be disposed on the non-active area NA. That is, the gate driver GD and the power supply PS may be disposed on the non-active area NA. Further, on the non-active area NA, a plurality of pads connected to the gate driver GD and the data driver DD may be disposed and each pad may be connected to each of the plurality of pixels PX of the active area AA.

The pattern layer 120 may be disposed between the lower substrate 111 and the upper substrate 112. Specifically, as illustrated in FIG. 4, the pattern layer 120 may include lower pattern layers 121a and 122a and upper pattern layers 121b and 122b. The lower pattern layers 121a and 122a are pattern layers which are disposed on the lower substrate 111 to be in contact with the lower substrate 111. The upper pattern layers 121b and 122b are pattern layers which are disposed on the upper substrate 112 to be in contact with the upper substrate 112.

Referring to FIGS. 1A and 1B, the pattern layer 120 may include a plurality of plate patterns 121, which include plates 121a and 121b which are each disposed as islands which are spaced apart from each other and a plurality of line patterns 122, which include 122a and 122b which connects the plurality of plate patterns.

Specifically, as illustrated in FIG. 2, the lower pattern layers 121a and 122a may include a plurality of lower plate patterns 121a which is disposed as islands which are spaced apart from each other and a plurality of lower line patterns 122a which connects the plurality of lower plate patterns 121a. As illustrated in FIG. 3, the upper pattern layers 121b and 122b may include a plurality of upper plate patterns 121b which is disposed as islands which are spaced apart from each other and a plurality of upper line patterns 122b which connects the plurality of upper plate patterns 121b.

Referring to FIGS. 1A, 1B, 2, and 4, a plurality of pixels PX may be formed on the plurality of lower plate patterns 121a disposed in the active area AA. Further, the gate driver GD and the power supply PS may be disposed on the plurality of lower plate patterns 121a disposed in the non-active area NA.

In other words, the plurality of pixels PX may be formed below the plurality of upper plate patterns 121b disposed in the active area AA. Further, the gate driver GD and the power supply PS may be formed below the upper pattern layers 121b and 122b disposed in the non-active area NA.

The plurality of upper plate patterns 121b and the plurality of lower plate patterns 121a may be individually separated, respectively. Accordingly, the plurality of upper plate patterns 121b may also be referred to as a plurality of upper island patterns or upper individual patterns. The plurality of lower plate patterns 121a may also be referred to as a plurality of lower island patterns or lower individual patterns.

In one exemplary embodiment, the gate driver GD may be mounted on the plurality of lower plate patterns 121a disposed in the non-active area NA. Various circuit configurations which configure the gate driver GD, such as various transistors, capacitors, and wiring lines, may be disposed on the plurality of lower plate patterns 121a disposed in the non-active area NA. However, this is illustrative, so that the exemplary embodiment of the present disclosure is not limited thereto and the gate driver GD may also be mounted on the plurality of lower plate patterns 121a disposed in the non-active area NA in a chip on film (COF) manner.

In one exemplary embodiment, the power supply PS may be mounted on the plurality of lower plate patterns 121a disposed in the non-active area NA. Power blocks which are disposed on different layers from each other may be disposed on the plurality of lower plate patterns 121a disposed in the non-active area NA.

According to the exemplary embodiment, as illustrated in FIGS. 1A and 1B, sizes of the plurality of lower plate patterns 121a disposed in the non-active area NA may be larger than sizes of the plurality of lower plate patterns 121a disposed in the active area AA. To be more specific, an area occupied by various circuit configurations which configure one stage of the gate driver GD is relatively larger than an area occupied by the pixels PX. Therefore, a size of the plurality of lower plate patterns 121a disposed in the non-active area NA may be larger than a size of the plurality of lower plate patterns 121a disposed in the active area AA.

Even though in FIG. 1A, it is illustrated that the plurality of lower plate patterns 121a disposed in the plurality of non-active areas NA is disposed on both sides of a second direction Y in the active area AA, this is illustrative, but the exemplary embodiment of the present disclosure is not limited thereto. For example, as illustrated in FIG. 1B, the plurality of lower plate patterns 121a disposed in the non-active area NA may be disposed not only in both sides of the second direction Y in the active area AA, but also in one side of the first direction X. Further, even though in FIGS. 1A, 1B, and 2, the plurality of lower plate patterns 121a has a square shape, this is illustrative and the exemplary embodiment of the present disclosure is not limited thereto and the plurality of lower plate patterns 121a may be modified in various forms.

In the meantime, the plurality of lower line patterns 122a is patterns which connect adjacent lower plate patterns 121a and may be referred to as lower connection patterns. That is, the plurality of lower line patterns 122a may be disposed between the plurality of lower plate patterns 121a.

The plurality of upper line patterns 122b is patterns which connect adjacent upper plate patterns 121b and may be referred to as upper connection patterns. That is, the plurality of upper line patterns 122b may be disposed between the plurality of upper plate patterns 121b.

In one exemplary embodiment, referring to FIGS. 1A and 1B, the plurality of upper line patterns 122b and the plurality of lower line patterns 122a may have a wavy shape. For example, the plurality of upper line patterns 122b and the plurality of lower line patterns 122a may have a sinusoidal shape, respectively. However, this is just illustrative and the shapes of the plurality of upper line patterns 122b and the plurality of lower line patterns 122a are not limited thereto. For example, the plurality of upper line patterns 122b and the plurality of lower line patterns 122a may also have a zigzag shape. As another example, the plurality of upper line patterns 122b and the plurality of lower line patterns 122a may also have various shapes such as a plurality of rhombic substrates which is connected at their vertexes to be extended. As described above, a number and a shape of the plurality of upper line patterns 122b and the plurality of lower line patterns 122a illustrated in FIGS. 1A and 1B are illustrative and the number and the shape of the plurality of upper line patterns 122b and the plurality of lower line patterns 122a may vary depending on the design.

In one exemplary embodiment, the plurality of upper plate patterns 121b, the plurality of lower plate patterns 121a, the plurality of upper line patterns 122b, and the plurality of lower line patterns 122a may be rigid patterns, respectively. For example, the plurality of upper plate patterns 121b, the plurality of lower plate patterns 121a, the plurality of upper line patterns 122b, and the plurality of lower line patterns 122a may be more rigid compared to the lower substrate 111 and the upper substrate 112, respectively. Accordingly, the modulus of elasticity of the plurality of upper plate patterns 121b, the plurality of lower plate patterns 121a, the plurality of upper line patterns 122b, and the plurality of lower line patterns 122a may be higher than a modulus of elasticity of the lower substrate 111 and the upper substrate 112. The modulus of elasticity is a parameter representing a rate of deformation against the stress applied to the substrate and the higher the modulus of elasticity, the higher the hardness. Moduli of elasticity of the plurality of upper plate patterns 121b, the plurality of lower plate patterns 121a, the plurality of upper line patterns 122b, and the plurality of lower line patterns 122a may be 1000 times or higher than the moduli of elasticity of the lower substrate 111 and the upper substrate 112. However, this is illustrative and the exemplary embodiment of the present disclosure is not limited thereto.

In one exemplary embodiment, each of the plurality of upper plate patterns 121b, the plurality of lower plate patterns 121a, the plurality of upper line patterns 122b, and the plurality of lower line patterns 122a may be include a plastic material having a lower flexibility than the lower substrate 111 and the upper substrate 112. For example, the plurality of upper plate patterns 121b, the plurality of lower plate patterns 121a, the plurality of upper line patterns 122b, and the plurality of lower line patterns 122a may include at least one material of polyimide (PI), polyacrylate, and polyvinyl acetate, respectively. According to an exemplary embodiment, the plurality of upper plate patterns 121b, the plurality of lower plate patterns 121a, the plurality of upper line patterns 122b, and the plurality of lower line patterns 122a may also be formed of the same material, but is not limited thereto and may also be formed of different materials from each other. When the plurality of upper plate patterns 121b, the plurality of lower plate patterns 121a, the plurality of upper line patterns 122b, and the plurality of lower line patterns 122a are formed of the same material, the plurality of upper plate patterns 121b and the plurality of upper line patterns 122b may be integrally formed. Further, the plurality of lower plate patterns 121a and the plurality of lower line patterns 122a may be integrally formed.

In some exemplary embodiments, the lower substrate 111 may include a plurality of first lower patterns and a second lower pattern. The plurality of first lower patterns may be an area overlapping the plurality of upper plate patterns 121b and the plurality of lower plate patterns 121a of the lower substrate 111, but the second lower pattern may be an area which does not overlap the plurality of upper plate patterns 121b and lower plate patterns 121a.

Further, the upper substrate 112 may include a plurality of first upper patterns and a second upper pattern. The plurality of first upper patterns may be an area overlapping the plurality of upper plate patterns 121b and lower plate patterns 121a of the lower substrate 111, but the second upper pattern may be an area which does not overlap the plurality of upper plate patterns 121b and lower plate patterns 121a.

At this time, moduli of elasticity of the plurality of first lower patterns and the first upper pattern may be higher than moduli of elasticity of the second lower pattern and the second upper pattern. For example, the plurality of first lower patterns and first upper patterns may be formed of the same material as the plurality of upper plate patterns 121b and lower plate patterns 121a. The second lower pattern and the second upper pattern may be formed of a material having a modulus of elasticity lower than those of the plurality of upper plate patterns 121b and lower plate patterns 121a.

For example, the first lower pattern and the first upper pattern may also be formed of polyimide (PI), polyacrylate, or polyvinyl acetate. Further, the second lower pattern and the second upper pattern may be formed of silicon rubber such as polydimethylsiloxane (PDMS) or elastomer such as polyurethane (PU) or polytetrafluoroethylene (PTFE).

Driving Element of Non-Active Area

The gate driver GD may supply a gate voltage to the plurality of pixels PX disposed in the active area AA. The gate driver GD includes a plurality of stages formed on the plurality of lower plate patterns 121a disposed in the non-active area NA and each stage included in the gate driver GD may be electrically connected to each other by means of the plurality of gate connection lines. Accordingly, a gate voltage output from any one of stages may be transmitted to the other stage. Each stage may sequentially supply the gate voltage to the plurality of pixels PX connected to each stage.

The power supply PS is connected to the gate driver GD to supply a gate driving voltage and a gate clock voltage to the gate driver GD. The power supply PS is connected to the plurality of pixels PX to supply a pixel driving voltage to each of the plurality of pixels PX. Further, the power supply PS may be formed on the plurality of lower plate patterns 121a disposed in the non-active area NA. That is, the power supply PS may be formed on the plurality of lower plate patterns 121a disposed in the non-active area NA to be adjacent to the gate driver GD. A plurality of power supplies PS formed on the plurality of lower plate patterns 121a disposed in the non-active area NA may be electrically connected to the gate driver GD and the plurality of pixels PX, respectively. That is, the plurality of power supplies PS formed on the plurality of lower plate patterns 121a disposed in the non-active area NA may be connected to the gate driver GD and the plurality of pixels PX by a gate power supply connection line and a pixel power supply connection line. Therefore, each of the plurality of power supplies PS may supply a gate driving voltage, a gate clock voltage, and a pixel driving voltage.

The printed circuit board PCB may transmit signals and voltages for driving the display element from the control unit to the display element. Therefore, the printed circuit board PCB may also be referred to as a driving substrate. A control unit such as an IC chip or a circuit unit may be mounted on the printed circuit board PCB. Further, on the printed circuit board PCB, a memory or a processor may also be mounted. The printed circuit board PCB provided in the display device 100 may include a stretching area and a non-stretching area to ensure stretchability. In the non-stretching area, an IC chip, a circuit unit, a memory, and a processor may also be mounted and in the stretching area, wiring lines which are electrically connected to the IC chip, the circuit unit, the memory, and the processor may be disposed.

The data driver DD may supply a data voltage to the plurality of pixels PX disposed in the active area AA. The data driver DD may also be configured as an IC chip so that it may also be referred to as a data integrated circuit D-IC. The data driver DD may be mounted in the non-stretching area of the printed circuit board PCB. That is, the data driver DD may be mounted on the printed circuit board PCB in the form of a chip on board (COB). Even though in FIGS. 1A and 1B, it is illustrated that the data driver DD is mounted in a chip on film (COF) manner, it is not limited thereto and the data driver DD may also be mounted by a chip on board (COB), a chip on glass (COG), or a tape carrier package (TCP) manner.

Further, even though in FIGS. 1A and 1B, one data driver DD is disposed so as to correspond to one line of the lower plate patterns 121a disposed in the active area AA, it is not limited thereto. For example, one data driver DD may also be disposed so as to correspond to a plurality of lines of lower plate patterns 121a.

Hereinafter, the active area AA of the display device 100 according to the exemplary embodiment of the present disclosure will be described in more detail with reference to FIGS. 4 and 5 together.

Planar and Cross-Sectional Structures of Active Area

Referring to FIGS. 2 and 4, a pixel PX including the plurality of sub pixels SPX may be disposed on the lower plate pattern 121a disposed on the lower substrate 111. Each of the plurality of sub pixels SPX may include a light emitting diode 170 which is a display element and a driving transistor 160 and a switching transistor 150 which drive the light emitting diode 170. However, in the sub pixel SPX, the display element is not limited to an LED, and may also be changed to an organic light emitting diode. For example, the plurality of sub pixels SPX may include a red sub pixel, a green sub pixel, and a blue sub pixel, but is not limited thereto and colors of the plurality of sub pixels SPX may be modified to various colors as needed.

The plurality of sub pixels SPX may be connected to the plurality of lower connection lines 181a and 182a. For example, the plurality of sub pixels SPX may be electrically connected to the first lower connection line 181a extending in the first direction X and the plurality of sub pixels SPX may be electrically connected to the second lower connection line 182a extending in the second direction Y.

Referring to FIGS. 3 and 4, a first conductive pattern CPA may be disposed on the upper plate pattern 121b disposed on the upper substrate 112 in the active area AA. The plurality of first conductive patterns CPA may be connected to the plurality of upper connection lines 181b. The upper connection line 181b extends in the first direction X and may be electrically connected to the plurality of first conductive patterns CPA.

Referring to FIG. 3, a plurality of light emitting diodes 170 corresponding to the plurality of sub pixels SPX may be disposed on the first conductive pattern CPA with respect to the upper substrate 112. The upper substrate 112 in which the plurality of light emitting diodes 170 is disposed may be bonded in the direction of the lower substrate 111. Therefore, the light emitting diode 170 may be bonded to each of the plurality of sub pixels SPX.

Hereinafter, a cross-sectional structure of the active area AA will be described in more detail with reference to FIG. 4.

Referring to FIG. 4, a plurality of inorganic insulating layers may be disposed on the plurality of lower plate patterns 121a disposed in the active area AA. For example, a plurality of inorganic insulating layers may include a buffer layer 141, a gate insulating layer 142, a first interlayer insulating layer 143, a second interlayer insulating layer 144, and a passivation layer 145. However, the exemplary embodiment of the present disclosure is not limited thereto and various inorganic insulating layers are additionally disposed on the plurality of lower plate patterns 121a. At least one of the buffer layer 141, the gate insulating layer 142, the first interlayer insulating layer 143, the second interlayer insulating layer 144, and the passivation layer 145 which are inorganic insulating layers may also be omitted.

To be more specific, the buffer layer 141 may be disposed on the plurality of lower plate patterns 121a disposed in the active area AA. The buffer layer 141 may be formed on the plurality of lower plate patterns 121a to protect various components of the display device 100 from permeation of moisture ($H_2O$) and oxygen ($O_2$) from the outside of the lower substrate 111 and the plurality of lower plate patterns 121a. The buffer layer 141 may include an insulating material. For example, the buffer layer 141 may include a single layer or a double layer formed of at least one of silicon nitride (SiNx), silicon oxide (SiOx), and silicon oxynitride (SiON). However, the buffer layer 141 may also be omitted depending on a structure or a characteristic of the display device 100.

Here, the buffer layer 141 may be formed only in an area where the lower substrate 111 overlaps the plurality of lower plate patterns 121a. As described above, the buffer layer 141 may be formed of an inorganic material so that the buffer layer 141 may be easily cracked or damaged during a process of stretching the display device 100. Therefore, the buffer layer 141 is not formed in an area between the plurality of lower plate patterns 121a, but is patterned to have a shape of the plurality of lower plate patterns 121a to be formed only above the plurality of lower plate patterns 121a. Therefore, in the display device 100 according to the exemplary embodiment of the present disclosure, the buffer layer 141 is formed only in an area overlapping the plurality of lower plate patterns 121a which are rigid patterns. Therefore, even though the display device 100 is bent or extended to be deformed, the damage of various components of the display device 100 may be reduced.

A switching transistor 150 including a gate electrode 151, an active layer 152, a source electrode 153, and a drain electrode 154 and a driving transistor 160 including a gate electrode 161, an active layer 162, a source electrode and a drain electrode 164 are formed on the buffer layer 141.

First, the active layer 152 of the switching transistor 150 and the active layer 162 of the driving transistor 160 may be disposed on the buffer layer 141. For example, the active layer 152 of the switching transistor 150 and the active layer 162 of the driving transistor 160 may also be formed of oxide semiconductors. Alternatively, the active layer 152 of the switching transistor 150 and the active layer 162 of the driving transistor 160 may be formed of amorphous silicon (a-Si), polycrystalline silicon (poly-Si), or an organic semiconductor.

The gate insulating layer 142 may be disposed on the active layer 152 of the switching transistor 150 and the active layer 162 of the driving transistor 160. The gate insulating layer 142 electrically insulates the gate electrode 151 of the switching transistor 150 from the active layer 152 of the switching transistor 150 and may electrically insulate the gate electrode 161 of the driving transistor 160 from the active layer 162 of the driving transistor 160. The gate insulating layer 142 may include an insulating material. For example, the gate insulating layer 142 may include a single layer of silicon nitride (SiNx) or silicon oxide (SiOx) which is an inorganic material or a multiple layer of silicon nitride (SiNx) or silicon oxide (SiOx), but it is not limited thereto.

The gate electrode 151 of the switching transistor 150 and the gate electrode 161 of the driving transistor 160 may be disposed on the gate insulating layer 142. The gate electrode 151 of the switching transistor 150 and the gate electrode 161 of the driving transistor 160 may be disposed on the gate insulating layer 142 to be spaced apart from each other. The gate electrode 151 of the switching transistor 150 overlaps the active layer 152 of the switching transistor 150 and the gate electrode 161 of the driving transistor 160 may overlap the active layer 162 of the driving transistor 160.

The gate electrode 151 of the switching transistor 150 and the gate electrode 161 of the driving transistor 160 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The first interlayer insulting layer 143 may be disposed on the gate electrode 151 of the switching transistor 150 and the gate electrode 161 of the driving transistor 160. The first interlayer insulating layer 143 may insulate the gate electrode 161 of the driving transistor 160 from an intermediate metal layer IM. The first interlayer insulating layer 143 may be formed of an inorganic material, similarly to the buffer layer 141. For example, the first interlayer insulating layer 143 may include a single layer of silicon nitride (SiNx) or silicon oxide (SiOx) which is an inorganic material or a multiple layer of silicon nitride (SiNx) or silicon oxide (SiOx), but it is not limited thereto.

The intermediate metal layer IM may be disposed on the first interlayer insulating layer 143. The intermediate metal layer IM may overlap the gate electrode 161 of the driving transistor 160. Therefore, a capacitor (for example, a storage capacitor) may be formed in an overlapping area of the intermediate metal layer IM and the gate electrode 161 of the driving transistor 160. Specifically, the storage capacitor may be formed by the gate electrode 161 of the driving transistor 160, the first interlayer insulating layer 143, and the intermediate metal layer IM. However, the placement area of the intermediate metal layer IM is not limited thereto and the intermediate metal layer IM overlaps the other electrode to form the storage capacitor in various forms.

The intermediate metal layer IM may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The second interlayer insulating layer 144 may be disposed on the intermediate metal layer IM. The second interlayer insulating layer 144 may insulate the gate electrode 151 of the switching transistor 150 from the source electrode 153 and the drain electrode 154 of the switching transistor 150. The second interlayer insulating layer 144 may insulate the intermediate metal layer IM from the source electrode and the drain electrode 164 of the driving transistor 160. The second interlayer insulating layer 144 may be formed of an inorganic material, which is the same as the buffer layer 141. For example, the first interlayer insulating layer 143 may include a single layer of silicon nitride (SiNx) or silicon oxide (SiOx) which is an inorganic material or a multiple layer of silicon nitride (SiNx) or silicon oxide (SiOx), but it is not limited thereto.

The source electrode 153 and the drain electrode 154 of the switching transistor 150 may be disposed on the second interlayer insulating layer 144. The source electrode and the drain electrode 164 of the driving transistor 160 may be disposed on the second interlayer insulating layer 144. The source electrode 153 and the drain electrode 154 of the switching transistor 150 may be disposed on the same layer to be spaced apart from each other. Even though in FIG. 4, the source electrode of the driving transistor 160 is omitted, the source electrode of the driving transistor 160 may also be disposed to be spaced apart from the drain electrode 164 on the same layer. In the switching transistor 150, the source electrode 153 and the drain electrode 154 may be in contact with the active layer 152 to be electrically connected to the active layer 152. In the driving transistor 160, the source electrode and the drain electrode 164 may be in contact with the active layer 162 to be electrically connected to the active layer 162. The drain electrode 154 of the switching transistor 150 is in contact with the gate electrode 161 of the driving transistor 160 through a contact hole to be electrically connected to the gate electrode 161 of the driving transistor 160.

The source electrode 153 and the drain electrodes 154 and 164 may include any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

Further, in this specification, even though it is described that the driving transistor 160 has a coplanar structure, various transistors such as having a staggered structure may also be used. Further, in this specification, the transistor may be formed not only to have a top gate structure, but also to have a bottom gate structure.

A gate pad and a data pad DP may be disposed on the second interlayer insulating layer 144.

Specifically, the gate pad may be a pad which transmits a gate voltage to the plurality of sub pixels SPX. The gate pad may be connected to the first lower connection line 181a through a contact hole. Further, the gate voltage supplied from the first lower connection line 181a may be transmitted to the gate electrode 151 of the switching transistor 150 from the gate pad through a wiring line formed on the lower plate pattern 121a.

The data pad DP may be a pad which transmits a data voltage to the plurality of sub pixels SPX. The data pad DP may be connected to the second lower connection line 182a through a contact hole. Further, the data voltage supplied from the second lower connection line 182a may be transmitted to the source electrode 153 of the switching transistor 150 from the data pad DP through a wiring line formed on the lower plate pattern 121a.

A voltage pad VP may be a pad which transmits a high potential voltage to the plurality of sub pixels SPX. The voltage pad VP may be connected to the first lower connection line 181a through a contact hole. Further, a high potential voltage supplied from the first lower connection line 181a may be transmitted to the driving transistor 160 from the voltage pad VP through a wiring line formed on the lower plate pattern 121a. The above-described high potential voltage may be referred to as a second driving voltage and a low potential voltage to be described below may be referred to as a first driving voltage.

The gate pad, the data pad DP, and the voltage pad VP may be formed of the same material as the source electrode 153 and the drain electrodes 154 and 164, but are not limited thereto.

The passivation layer 145 may be formed on the switching transistor 150 and the driving transistor 160. That is, the passivation layer 145 covers the switching transistor 150 and the driving transistor 160 to protect the switching transistor 150 and the driving transistor 160 from the permeation of moisture and oxygen. The passivation layer 145 may be formed of an inorganic material and include a single layer or a double layer, but is not limited thereto.

The gate insulating layer 142, the first interlayer insulating layer 143, the second interlayer insulating layer 144, and the passivation layer 145 are patterned to be formed only in an area overlapping the plurality of lower plate patterns 121a. The gate insulating layer 142, the first interlayer insulating layer 143, the second interlayer insulting layer 144, and the passivation layer 145 may also be formed of the inorganic material, similar to the buffer layer 141. Therefore, the gate insulating layer 142, the first interlayer insulating layer 143, the second interlayer insulating layer 144, and the passivation layer 145 may also be easily cracked, and thus damaged during the process of stretching the display device 100. Therefore, the gate insulating layer 142, the first interlayer insulating layer 143, the second interlayer insulating layer 144, and the passivation layer 145 are not formed in an area between the plurality of lower plate patterns 121a, but are patterned to have a shape of the plurality of lower plate patterns 121a to be formed only above the plurality of lower plate patterns 121a.

The planarization layer 146 may be formed on the passivation layer 145. The planarization layer 146 may planarize upper portions of the switching transistor 150 and the driving transistor 160. The planarization layer 146 may be configured by a single layer or a plurality of layers and may be formed of an organic material. Therefore, the planarization layer 146 may also be referred to as an organic insulating layer. For example, the planarization layer 146 may be formed of an acrylic organic material, but is not limited thereto.

Referring to FIG. 4, the planarization layer 146 may be disposed so as to cover top surfaces and side surfaces of the buffer layer 141, the gate insulating layer 142, the first interlayer insulating layer 143, the second interlayer insulating layer 144, and the passivation layer 145 on the plurality of lower plate patterns 121a. Further, the planarization layer 146 may enclose the buffer layer 141, the gate insulating layer 142, the first interlayer insulating layer 143, the second interlayer insulating layer 144, and the passivation layer 145 together with the plurality of lower plate patterns 121a. To be more specific, the planarization layer 146 may be disposed so as to cover a top surface and a side surface of the passivation layer 145, a side surface of the first interlayer insulating layer 143, a side surface of the second interlayer insulating layer 144, a side surface of the gate insulating layer 142, a side surface of the buffer layer 141, and a part of a top surface of the plurality of lower plate patterns 121a. Accordingly, the planarization layer 146 may supplement a step on side surfaces of the buffer layer 141, the gate insulating layer 142, the first interlayer insulating layer 143, the second interlayer insulating layer 144, and the passivation layer 145. Further, the planarization layer 146 may enhance an adhesive strength with the lower connection lines 181a and 182a disposed on a side surface of the planarization layer 146.

Referring to FIG. 4, an inclination angle of the side surface of the planarization layer 146 may be smaller than an inclination angle formed by side surfaces of the buffer layer 141, the gate insulating layer 142, the first interlayer insulating layer 143, the second interlayer insulating layer 144, and the passivation layer 145. For example, the side surface of the planarization layer 146 may have a slope which is gentler than a slope formed by the side surface of the passivation layer 145, the side surface of the first interlayer insulating layer 143, the side surface of the second interlayer insulating layer 144, the side surface of the gate insulating layer 142, and the side surface of the buffer layer 141. Therefore, the lower connection lines 181a and 182a which are disposed to be in contact with the side surface of the planarization layer 146 are disposed with a gentle slope so that when the display device 100 is stretched, the stress generated in the lower connection lines 181a and 182a may be reduced. Further, the side surface of the planarization layer 146 has a relatively gentle slope so that the crack of the lower connection lines 181a and 182a or separation from the side surface of the planarization layer 146 may be reduced.

Referring to FIGS. 2 to 4, the lower connection lines 181a and 182a refer to wiring lines which electrically connect the pads on the plurality of lower plate patterns 121a. The lower connection lines 181a and 182a may be disposed on the plurality of lower line patterns 122a. Further, the lower line pattern 122a is not disposed in an area between the plurality of lower plate patterns 121a in which the lower connection lines 181a and 182a are not disposed.

The lower connection lines 181a and 182a may include a first lower connection line 181a and a second lower connection line 182a. The first lower connection line 181a and the second lower connection line 182a may be disposed between the plurality of lower plate patterns 121a. Specifically, the first lower connection line 181a refers to a wiring line extending in a first direction X between the plurality of lower plate patterns 121a, among the lower connection lines 181a and 182a. The second lower connection line 182a may refer to a wiring line extending in a second direction Y between the plurality of lower plate patterns 121a, among the lower connection lines 181a and 182a.

The lower connection lines 181a and 182a may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

In the case of a display panel of a general display device, various wiring lines such as a plurality of gate lines and a plurality of data lines extend between the plurality of sub pixels as a straight line and the plurality of sub pixels is connected to one signal line. Therefore, in the display panel of the general display device, various wiring lines, such as a gate line, a data line, a high potential voltage line, and a reference voltage line, may extend from one side to the other side of the display panel of the organic light emitting display device without being disconnected on the substrate.

In contrast, in the display device 100 according to the exemplary embodiment of the present disclosure, various wiring lines, such as a gate line, a data line, a high potential voltage line, a reference voltage line, or an initialization voltage line having a straight line shape which are considered to be used for the display panel of the general display device, may be disposed only on the plurality of lower plate patterns 121a. That is, in the display device 100 according to the exemplary embodiment of the present disclosure, a linear wiring line may be disposed only on the plurality of lower plate patterns 121a.

In the display device 100 according to the exemplary embodiment of the present disclosure, the pads on two adjacent lower plate patterns 121a may be connected by the lower connection lines 181a and 182a. Accordingly, the lower connection lines 181a and 182a may electrically connect the gate pads, the data pads DP, or the voltage pad VP on two adjacent lower plate patterns 121a. Accordingly, the display device 100 according to the exemplary embodiment of the present disclosure may include a plurality of lower connection lines 181a and 182a which electrically connects various wiring lines, such as a gate line, a data line, a high potential voltage line, and a reference voltage line, between the plurality of lower plate patterns 121a. For example, the gate line may be disposed on the plurality of lower plate patterns 121a disposed to be adjacent to each other in the first direction X and the gate pad may be disposed on both ends of the gate line. In this case, the plurality of gate pads on the plurality of lower plate patterns 121a disposed to be adjacent to each other in the first direction X may be connected to each other by the first lower connection line 181a which serves as a gate line. Therefore, the gate line disposed on the plurality of lower plate patterns 121a and the first lower connection line 181a disposed on the lower line pattern 122a may serve as one gate line. The above-described gate line may be referred to as a scan signal line. Further, wiring lines which extend in the first direction X, among all various wiring lines which may be included in the display device 100, such as an emission signal line and a high potential voltage line, may also be electrically connected by the first lower connection line 181a, as described above.

Referring to FIGS. 2 and 4, the first lower connection lines 181a may connect the voltage pads VP on two lower plate patterns 121a which are disposed side by side, among the voltage pads VP on the plurality of lower plate patterns 121a disposed to be adjacent in the first direction X. The first lower connection line 181a may serve as a scan signal line and an emission signal line which are gate lines, but is not limited thereto. The voltage pad VP on the plurality of lower plate patterns 121a disposed in the first direction X may be connected by the first lower connection line 181a serving as a high potential voltage line and transmit high potential voltage.

Further, the second lower connection line 182a may connect the data pads DP on two lower plate patterns 121a which are disposed side by side, among the data pads DP on the plurality of lower plate patterns 121a disposed to be adjacent in the second direction Y. The second lower connection line 182a may server as a data line or a reference voltage line, but is not limited thereto. An internal line on the plurality of lower plate patterns 121a disposed in the second direction Y may be connected by the plurality of second lower connection lines 182a serving as a data line and transmit data voltage.

As illustrated in FIG. 4, the first lower connection line 181a may be disposed to be in contact with a top surface and side surfaces of the planarization layer 146 disposed on the lower plate pattern 121a. The first lower connection line 181a may extend to the top surface of the lower line pattern 122a. Further, the second lower connection line 182a may be disposed to be in contact with a top surface and side surfaces of the planarization layer 146 disposed on the lower plate pattern 121a. The second lower connection line 182a may extend to the top surface of the lower line pattern 122a.

However, there is no need to dispose a rigid pattern in an area in which the first lower connection line 181a and the second lower connection line 182a are not disposed, so that the lower line pattern 122a which is a rigid pattern is not disposed below the first lower connection line 181a and the second lower connection line 182a.

In the meantime, referring to FIG. 4, a bank 147 may be formed on the connection pad CNT, the lower connection lines 181a and 182a, and the planarization layer 146. The bank 147 is a component which divides adjacent sub pixels SPX. The bank 147 may be disposed so as to cover at least a part of the connection pad CNT, the lower connection lines 181a and 182a, and the planarization layer 146. The bank 147 may be formed of an insulating material. Further, the bank 147 may include a black material. The bank 147 includes the black material to block wiring lines which may be visible through the active area AA. For example, the bank 147 may be formed of a carbon based mixture and for example, include carbon black. However, it is not limited thereto and the bank 147 may also be formed of a transparent insulating material. Even though in FIGS. 1A and 1B, it is illustrated that a height of the bank 147 is lower than a height of the light emitting diode 170, the present disclosure is not limited thereto and the height of the bank 147 may be equal to the height of the light emitting diode 170.

Referring to FIG. 4, the light emitting diode 170 may be disposed on the connection pad CNT and the first lower connection line 181a. The light emitting diode 170 includes a first electrode 171, a first semiconductor layer 172, an emission layer 173, a second semiconductor layer 174, and a second electrode 175. The first semiconductor layer 172, the emission layer 173, the second semiconductor layer 174, and the second electrode 175 may be sequentially disposed on the first electrode 171. Therefore, the light emitting diode 170 is a vertical light emitting diode 170 in which the second electrode 175 is disposed on the first electrode 171.

In one embodiment, the bank layer has an opening 197 and entire LED may be positioned within the opening 197 in the bank. Namely, the bank layer 147 is fully formed over the planarization layer 146. After this, the opening 197 is made, such as by a pattern and etch technique and it results in side walls of the bank layer 147 on both sides of the opening 197. The anode, light electron and hole transport layers, light emitting layer and cathode all formed within this opening 197 after it is made and are positioned spaced from the bank layer. It is a vertical LED, with no portion of the bank layer overlaying them and no portion of them overlaying the bank layer. All layers, namely the anode, light generation layers and cathode that make up the LED are spaced from the walls of the bank layer 147. In a preferred embodiment, the bank layer 147 is fully formed, the opening 197 is then formed, after which the anode is formed, then the light emitting layers, then the cathode. After this, the upper substrate 112 is overlaid on the LED, as shown in FIG. 4.

The first semiconductor layer 172 is disposed on the first adhesive layer AD1 and the second semiconductor layer 174 is disposed on the first semiconductor layer 172. The first semiconductor layer 172 and the second semiconductor layer 174 may be layers formed by doping n-type and p-type impurities into a specific material. For example, the first semiconductor layer 172 and the second semiconductor layer 174 may be layers formed by doping p-type and n-type impurities into a material, such as gallium nitride (GaN), indium aluminum phosphide (InAlP), or gallium arsenide (GaAs). The p-type impurity may be magnesium (Mg), zinc (Zn), and beryllium (Be), and the n-type impurity may be silicon (Si), germanium, and tin (Sn), but are not limited thereto.

The emission layer 173 is disposed between the first semiconductor layer 172 and the second semiconductor layer 174. The emission layer 173 is supplied with holes and electrons from the first semiconductor layer 172 and the second semiconductor layer 174 to emit light. The emission layer 173 may be formed by a single layer or a multi-quantum well (MQW) structure, and for example, may be formed of indium gallium nitride (InGaN) or gallium nitride (GaN), but is not limited thereto.

The first electrode 171 is disposed below the first semiconductor layer 172. The first electrode 171 may be disposed on the bottom surface of the first semiconductor layer 172. The first electrode 171 is an electrode which electrically connects the driving transistor 160 and the first semiconductor layer 172. The first electrode 171 may include a conductive material, for example, a transparent conductive material, such as indium tin oxide (ITO) or indium zinc oxide (IZO) or an opaque conductive material, such as titanium (Ti), gold (Au), silver (Ag), and copper (Cu) or an alloy thereof, but is not limited thereto.

The second electrode 175 is disposed on the second semiconductor layer 174. The second electrode 175 may be disposed on the top surface of the second semiconductor layer 174. The second electrode 175 is an electrode which electrically connects the first conductive pattern CPA and the second semiconductor layer 174. The second electrode 175 may include a transparent conductive material, such as indium tin oxide (ITO) or indium zinc oxide (IZO) or an opaque conductive material, such as titanium (Ti), gold (Au), silver (Ag), and copper (Cu) or an alloy thereof, but is not limited thereto.

The first adhesive layer AD1 is disposed between the connection pad CNT and the first electrode 171 so that the light emitting diode 170 may be bonded onto the connection pad CNT. The second adhesive layer AD2 is disposed between the first conductive pattern CPA and the second electrode 175 so that the light emitting diode 170 may be bonded below the first conductive pattern CPA.

The first adhesive layer AD1 and the second adhesive layer AD2 may be conductive adhesive layers in which conductive balls are dispersed in an insulating base member. Therefore, when heat or a pressure is applied to the adhesive layer AD, the conductive balls are electrically connected in a portion applied with the heat or pressure to have a conductive property.

The connection pad CNT is electrically connected to the drain electrode 164 of the driving transistor 160 to be applied with a driving voltage from the driving transistor 160 to drive the light emitting diode 170. The electrical connection from the drain electrode 164 to the connection pad CNT is present in the various layers including one or more of 141 to 146. This connection is not seen in FIG. 4 because is it in is different plane. Even though in the view seen in FIG. 4, it is illustrated that the connection pad CNT is not in direct contact itself with the drain electrode 164, but is electrically connected using other conductors, not visible in this view, they do extend through contacts present in layers 145 and 146, and can extend through other layers as well if needed. Thus, the drain 164 of the driving transistor 160, is in indirect contact with CNT, but the present disclosure is not limited thereto. Therefore, the connection pad CNT1 and the drain electrode 164 of the driving transistor 160 may also be in direct contact with each other. Further, a low potential voltage may be applied to the first lower connection line 181a to drive the light emitting diode 170.

In the meantime, referring to FIG. 3, with respect to the upper substrate 112, the plurality of upper plate patterns 121b and the plurality of upper line patterns 122b which connects the plurality of upper plate patterns 121b may be disposed on the upper substrate 112. Referring to FIG. 4, with respect to the lower substrate 111, the plurality of upper plate patterns 121b and the plurality of upper line patterns 122b which connects the plurality of upper plate patterns 121b may be disposed below the upper substrate 112. That is, the plurality of upper plate patterns 121b and the plurality of upper line patterns 122b may be disposed to be in contact with the upper substrate 112.

Specifically, the plurality of upper line patterns 122b disposed in the active area AA connects upper plate patterns 121b which are disposed to be adjacent to each other in the first direction X. Therefore, the plurality of upper line patterns 122b may extend in the first direction X. However, it is not limited thereto and the plurality of upper line patterns 122b may extend to the first direction X or to the first direction X and the second direction Y, respectively.

With respect to the upper substrate 112, the first conductive pattern CPA is disposed on the upper plate pattern 121b disposed in the active area AA and the upper connection line 181b may be disposed on the upper line pattern 122b disposed in the active area AA. With respect to the lower substrate 111, the first conductive pattern CPA may be disposed below the upper plate pattern 121b disposed in the active area AA and the upper connection line 181b may be disposed below the upper line pattern 122b disposed in the active area AA.

The first conductive pattern CPA disposed in the active area AA may have the same shape as the upper plate pattern 121b. For example, the upper plate pattern 121b has island shapes which are spaced apart from each other so that the first conductive patterns CPA may also have island shapes which are spaced apart from each other. However, the shape of the first conductive pattern CPA is not limited thereto and may vary with various shapes overlapping the shape of the upper plate pattern 121b.

The upper connection line 181b may also have the same shape as the upper line pattern 122b. For example, the upper connection line 181b may also have a sinusoidal shape. However, it is just illustrative, so that the shape of the plurality of upper connection lines 181b is not limited thereto. For example, the plurality of upper line patterns 122b and the plurality of upper connection lines 181b may also have a zigzag shape. As another example, the plurality of upper connection lines 181b may also have various shapes, such as a plurality of rhombic substrates being connected and extending at vertices.

The plurality of first conductive patterns CPA and the plurality of upper connection line 181b may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti). However, it is not limited thereto. The plurality of first conductive patterns CPA and the plurality of upper connection lines 181b may be integrally formed, but it is not limited thereto.

A low potential voltage for driving the light emitting diode 170 may be applied to the plurality of first conductive patterns CPA and the plurality of upper connection lines 181b. That is, the plurality of first conductive patterns CPA and the plurality of upper connection lines 181b may configure a conductive surface to which one low potential voltage is applied.

Therefore, when the display device 100 is on, the driving voltage is applied to the first electrode 171 by means of the connection pad CNT and the low potential voltage may be applied to the second electrode by means of the first conductive pattern CPA. Therefore, different voltage levels are transmitted to the first electrode 171 and the second electrode 175 to allow the light emitting diode 170 to emit light.

The filling layer 190 may be disposed on the entire surface of the lower substrate 111 to be filled between the components disposed on the upper substrate 112 and the lower substrate 111. The filling layer 190 may include a curable adhesive. Specifically, the material which configures the filling layer 190 is coated on the entire surface of the lower substrate 111 and then is cured so that the filling layer 190 may be disposed between the components disposed on the upper substrate 112 and the lower substrate 111. For example, the filling layer 190 may be an optically clear adhesive (OCA) and may include an acrylic adhesive, a silicon based adhesive, and an urethane based adhesive.

As described above, the display device according to the exemplary embodiment of the present disclosure may supply a low potential voltage to the light emitting diode by means of the upper connection line 181b and the first conductive pattern CPA attached to the upper substrate 112.

A total area of the upper connection line 181b and the first conductive pattern CPA is larger than a total area of the lower connection lines 181a and 182a so that a total resistance of the upper connection line 181b and the first conductive pattern CPA may be relatively low.

Therefore, the voltage drop of the low potential voltage which is supplied through the upper connection line 181b and the first conductive pattern CPA may be reduced. Accordingly, a stable low potential voltage may be supplied to the light emitting diode 170.

As a result, the display device according to the exemplary embodiment of the present disclosure ensures a luminous efficiency and a stability of the light emitting diode 170 to improve an image quality.

Planar and Cross-Sectional Structures of Non-Active Area

Figure 5:
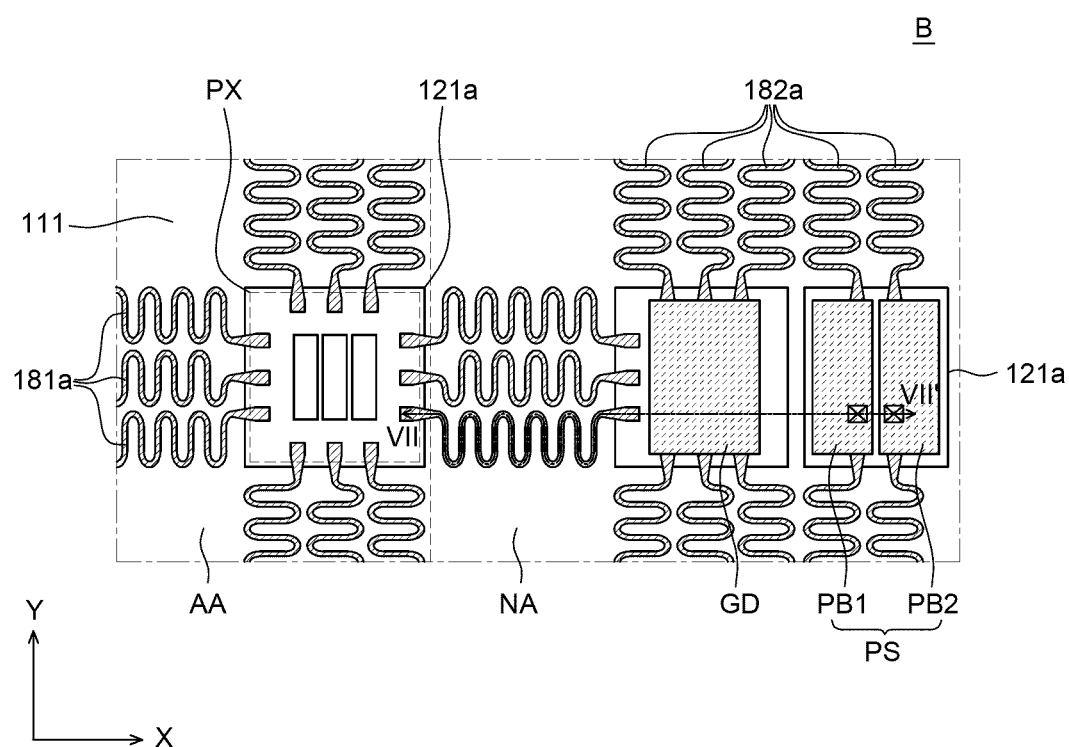
FIG. 5 is an enlarged plan view of a lower substrate disposed in a non-active area of a display device according to an exemplary embodiment of the present disclosure.

FIG. 5 is an enlarged plan view of a lower substrate disposed in a non-active area of a display device according to an exemplary embodiment of the present disclosure.

Figure 6:
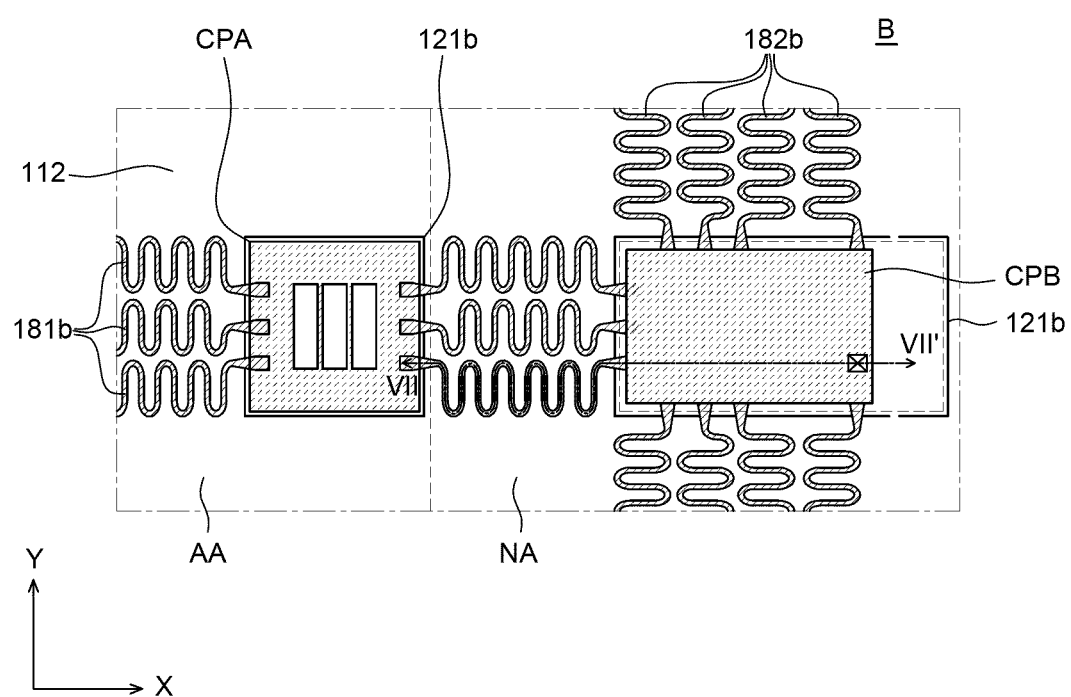
FIG. 6 is an enlarged plan view of an upper substrate disposed in a non-active area of a display device according to an exemplary embodiment of the present disclosure.

FIG. 6 is an enlarged plan view of an upper substrate disposed in a non-active area of a display device according to an exemplary embodiment of the present disclosure.

Figure 7:
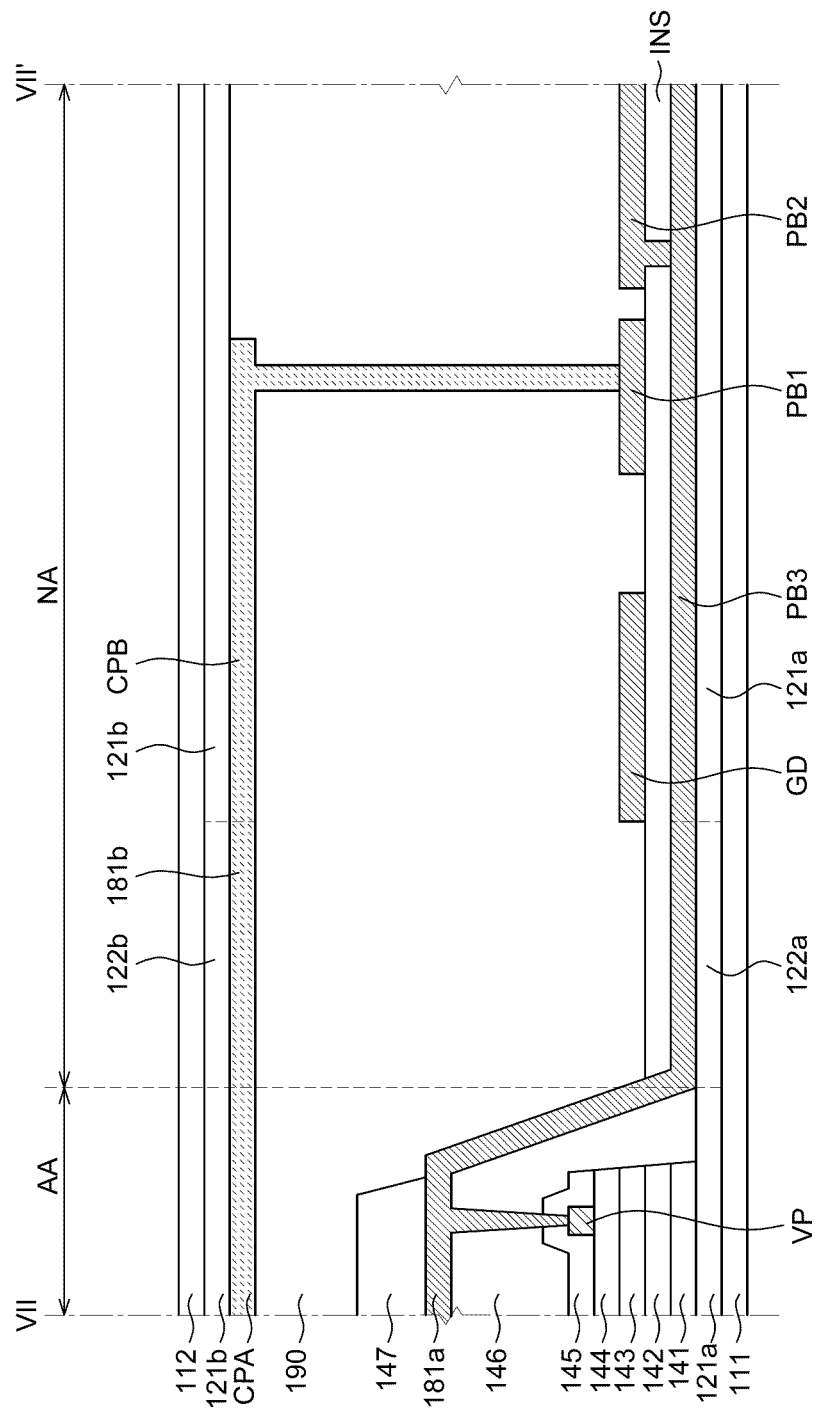
FIG. 7 is a cross-sectional view taken along the line VII-VII' of FIGS. 5 and 6.

FIG. 7 is a cross-sectional view taken along the line VII-VII' of FIGS. 5 and 6.

In FIG. 5, a lower substrate 111 and components disposed on the lower substrate 111 in an area B illustrated in FIGS. 1A and 1B are illustrated. Further, in FIG. 6, an upper substrate 112 and components disposed on the upper substrate 112 in an area B illustrated in FIGS. 1A and 1B are illustrated.

As illustrated in FIG. 5, the gate driver GD and the power supply PS may be disposed on the lower plate patterns 121a disposed in the non-active area NA.

Referring to FIG. 7, the power supply PS may include a first power block PB1, a second power block PB2, and a third power block PB3.

The first power block PB1 and the second power block PB2 may be disposed on the same layer. The third power block PB3 may be disposed on a different layer from the first power block PB1 and the second power block PB2.

For example, the third power block PB3 may be disposed on the lower plate pattern 121a disposed in the non-active area NA. The insulating layer INS may be disposed on the third power block PB3.

The first power block PB1 and the second power block PB2 may be disposed on the insulating layer INS. The gate driver GD may also be disposed on the insulating layer INS, but the placement relationship of the gate driver GD is just illustrative, and the gate driver GD may be disposed on the lower plate pattern 121a disposed in the non-active area NA.

Referring to FIG. 5, the first power block PB1 may be disposed inside from the second power block PB2. Each of the first power block PB1 and the second power block PB2 may be connected through the second lower connection line 182a disposed in the non-active area NA. Therefore, the adjacent first power blocks PB1 may be conducted through the second lower connection line 182a. Further, the adjacent second power block PB2 may be conducted through the second lower connection line 182a.

Referring to FIG. 7, the second power block PB2 and the third power block PB3 disposed on different layers from each other may be connected through the contact hole. The third power block PB3 may be connected to the first lower connection line 181a disposed in the non-active area NA. Therefore, the second power block PB2 and the third power block PB3 may be electrically connected to the voltage pad VP through the first lower connection line 181a.

In the meantime, as illustrated in FIG. 6, the second conductive pattern CPB may be disposed on the upper plate pattern 121b disposed in the non-active area NA with respect to the upper substrate 112.

In other words, as illustrated in FIG. 7, the second conductive pattern CPB may be disposed below the upper plate pattern 121b disposed in the non-active area NA with respect to the lower substrate 111.

The second conductive pattern CPB may be connected to the first upper connection line 181b disposed in the non-active area NA. The second conductive pattern CPB may be connected to the first power block PB1 through the contact hole. As described above, the first upper connection line 181b is connected to the first conductive pattern CPA so that the first power block PB1 and the second conductive pattern CPB may be electrically connected to the first conductive pattern CPA through the first upper connection line 181b.

In the meantime, each of the first power block PB1, the second power block PB2, the third power block PB3, the first conductive pattern CPA, and the second conductive pattern CPB may include a conductive material, for example, a transparent conductive material, such as indium tin oxide (ITO) or indium zinc oxide (IZO) or an opaque conductive material, such as titanium (Ti), gold (Au), silver (Ag), and copper (Cu) or an alloy thereof. However, they are not limited thereto.

The above-described first conductive pattern CPA and the second conductive pattern CPB may be formed of metal so that there may be a problem in that the external light of the display device is reflected, and thus, the visibility may be degraded.

Therefore, a low reflective material for improving the visibility may be added to each of the upper plate pattern 121b and the upper line pattern 122b which are upper pattern layers. For example, as the low reflective material, polarized iodine particles or dyes may be used, but is not limited thereto.

In summary, in the display device according to the exemplary embodiment of the present disclosure, the second power block PB2 and the third power block PB3 may be electrically connected to the voltage pad VP through the first lower connection line 181a. The first power block PB1 and the second conductive pattern CPB may be electrically connected to the first conductive pattern CPA through the first upper connection line 181b.

A low potential voltage may be applied to the first power block PB1 and a high potential voltage may be applied to the second power block PB2.

Therefore, the low potential voltage is applied to the first power block PB1 and the second conductive pattern CPB. The low potential voltage is also applied to the first conductive pattern CPA through the first upper connection line 181b so that the low potential voltage may be applied to the second electrode through the first conductive pattern CPA.

The high potential voltage is applied to the second power block PB2 and the third power block PB3. The high potential voltage may be applied to the voltage pad VP through the first lower connection line 181a.

Therefore, the high potential voltage is applied to the driving transistor through the voltage pad VP to supply a driving voltage to each light emitting diode.

As described above, according to the exemplary embodiment of the present disclosure, a plurality of conductive patterns and vertical light emitting diodes are formed in the upper substrate 112 and the transistor and the power supply PS for driving the light emitting diode is formed on the lower substrate 111. Thereafter, the upper substrate and the lower substrate are bonded to manufacture the display device.

That is, the light emitting diode of the display device according to the exemplary embodiment of the present disclosure is not bonded by a separate process, but the display device may be manufactured by one bonding process.

Therefore, it is advantageous in that a manufacturing yield of a light emitting diode of the display device may be improved.

Further, the display device according to the exemplary embodiment of the present disclosure may supply the low potential voltage through the plurality of conductive patterns and upper connection lines.

Therefore, there is no need to supply the low potential voltage through the lower connection line so that the number of lower connection lines may be relatively reduced.

As a result, a number of connection lines on the lower substrate 111 is reduced so that a stretching rate of the display device may be improved.

Further, according to the exemplary embodiment of the present disclosure, the vertical light emitting diode is applied so that a number of pixels to be disposed in a unit area, as compared with the example that the horizontal light emitting diode is applied, may be increased.

Accordingly, in the display device according to the exemplary embodiment of the present disclosure, it is advantageous in that the number of pixels is increased so that the resolution is improved.

Another Exemplary Embodiment of Present Disclosure

Hereinafter, a display device according to another exemplary embodiment of the present disclosure will be described. The difference between the display device according to the exemplary embodiment of the present disclosure and a display device according to another exemplary embodiment of the present disclosure is a power supply and a connection relationship thereof, which will be mainly described. In the display device according to the exemplary embodiment of the present disclosure and the display device according to another exemplary embodiment of the present disclosure, like component is denoted by like reference numeral and a redundant description will be omitted.

Figure 8:
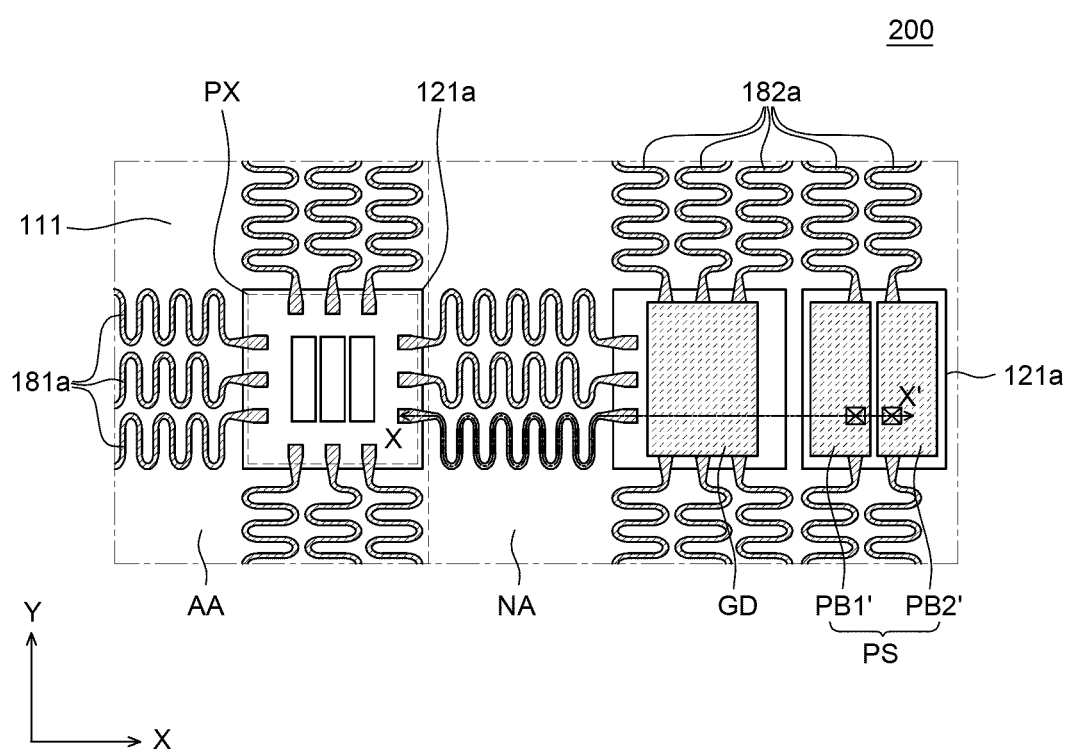
FIG. 8 is an enlarged plan view of a lower substrate disposed in a non-active area of a display device according to another exemplary embodiment of the present disclosure.

FIG. 8 is an enlarged plan view of a lower substrate disposed in a non-active area of a display device according to another exemplary embodiment of the present disclosure.

Figure 9:
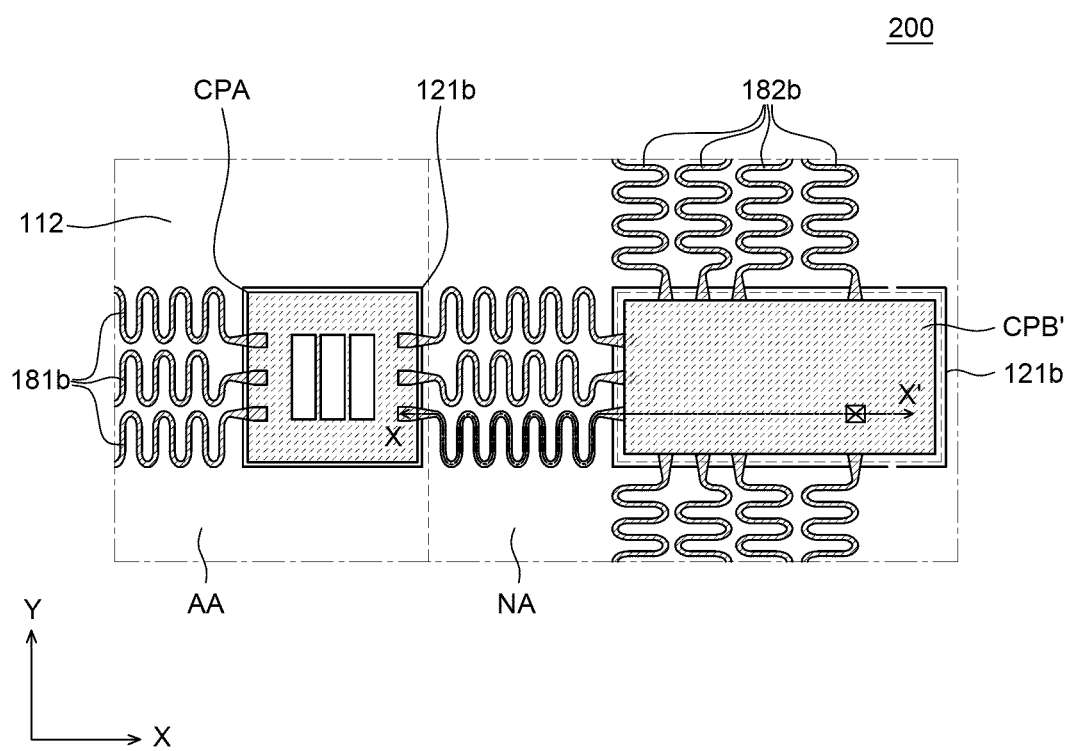
FIG. 9 is an enlarged plan view of an upper substrate disposed in a non-active area of a display device according to another exemplary embodiment of the present disclosure.

FIG. 9 is an enlarged plan view of an upper substrate disposed in a non-active area of a display device according to another exemplary embodiment of the present disclosure.

Figure 10:
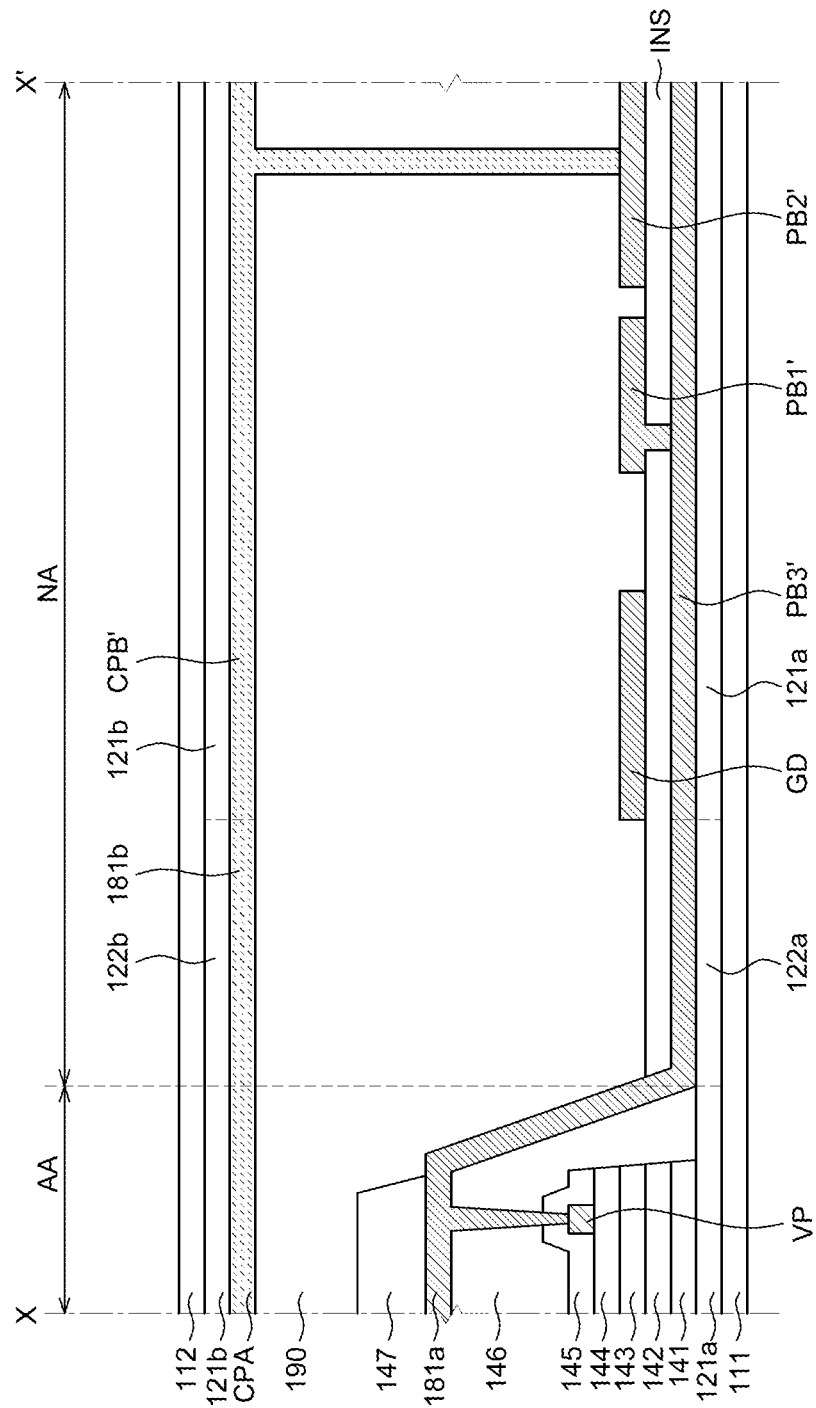
FIG. 10 is a cross-sectional view taken along the line X-X' of FIGS. 8 and 9.

FIG. 10 is a cross-sectional view taken along the line X-X' of FIGS. 8 and 9.

In FIG. 8, a lower substrate 111 and components disposed on the lower substrate 111 in an area B illustrated in FIGS. 1A and 1B are illustrated. Further, in FIG. 9, an upper substrate 112 and components disposed on the upper substrate 112 in an area B illustrated in FIGS. 1A and 1B are illustrated.

As illustrated in FIG. 8, the gate driver GD and the power supply PS may be disposed on the lower plate patterns 121a disposed in the non-active area NA.

Further referring to FIG. 10, the power supply PS may include a first power block PB1', a second power block PB2', and a third power block PB3'.

The first power block PB1' and the second power block PB2' may be disposed on the same layer. The third power block PB3' may be disposed on a different layer from the first power block PB1' and the second power block PB2'.

For example, the third power block PB3' may be disposed on the lower plate pattern 121a disposed in the non-active area NA. The insulating layer INS may be disposed on the third power block PB3'.

The first power block PB1' and the second power block PB2' may be disposed on the insulating layer INS. The gate driver GD may also be disposed on the insulating layer INS, but the placement relationship of the gate driver GD is just illustrative, and the gate driver GD may be disposed on the lower plate pattern 121a disposed in the non-active area NA.

Referring to FIG. 8, the first power block PB1' may be disposed inside from the second power block PB2'. Each of the first power block PB1' and the second power block PB2' may be connected through the second lower connection line 182a disposed in the non-active area NA. Therefore, the adjacent first power blocks PB1' may be conducted through the second lower connection line 182a. Further, the adjacent second power block PB2' may be conducted through the second lower connection line 182a.

Referring to FIG. 10, the first power block PB1' and the third power block PB3' disposed on different layers from each other may be connected through the contact hole. The third power block PB3' may be connected to the first lower connection line 181*a* disposed in the non-active area NA. Therefore, the first power block PB1' and the third power block PB3' may be electrically connected to the voltage pad VP through the first lower connection line 181*a*.

In the meantime, as illustrated in FIG. 9, the second conductive pattern CPB' may be disposed on the upper plate pattern 121*b* disposed in the non-active area NA with respect to the upper substrate 112.

In other words, as illustrated in FIG. 10, the second conductive pattern CPB' may be disposed below the upper plate pattern 121*b* disposed in the non-active area NA with respect to the lower substrate 111.

The second conductive pattern CPB' may also be connected to the first upper connection line 181*b* disposed in the non-active area NA. The second conductive pattern CPB' may be connected to the second power block PB2' through the contact hole. As described above, the first upper connection line 181*b* is connected to the first conductive pattern CPA so that the second power block PB2' and the second conductive pattern CPB' may be electrically connected to the first conductive pattern CPA through the first upper connection line 181*b*.

In the meantime, each of the first power block PB1', the second power block PB2', the third power block PB3', the first conductive pattern CPA and the second conductive pattern CPB' may include a conductive material, for example, a transparent conductive material, such as indium tin oxide (ITO) or indium zinc oxide (IZO) or an opaque conductive material, such as titanium (Ti), gold (Au), silver (Ag), and copper (Cu) or an alloy thereof. However, they are not limited thereto.

The above-described each of the first conductive pattern CPA and the second conductive pattern CPB' may be formed of metal so that there may be a problem in that the external light of the display device is reflected to degrade the visibility.

Therefore, a low reflective material for improving the visibility may be added to each of the upper plate pattern 121*b* and the upper line pattern 122*b* which are upper pattern layers. For example, as the low reflective material, polarized iodine particles or dyes may be used, but is not limited thereto.

In summary, in the display device according to another exemplary embodiment of the present disclosure, the first power block PB1' and the third power block PB3' may be electrically connected to the voltage pad VP through the first lower connection line 181*a*. The second power block PB2' and the second conductive pattern CPB' may be electrically connected to the first conductive pattern CPA through the first upper connection line 181*b*.

A high potential voltage may be applied to the first power block PB1' and a low potential voltage may be applied to the second power block PB2'.

Therefore, the low potential voltage is applied to the second power block PB2' and the second conductive pattern CPB'. The low potential voltage is also applied to the first conductive pattern CPA through the first upper connection line 181*b* so that the low potential voltage may be applied to the second electrode through the first conductive pattern CPA.

The high potential voltage is applied to the first power block PB1' and the third power block PB3'. The high potential voltage may be applied to the voltage pad VP through the first lower connection line 181*a*.

Therefore, the high potential voltage is applied to the driving transistor through the voltage pad VP to supply a driving voltage to each light emitting diode.

As described above, according to another exemplary embodiment of the present disclosure, a plurality of conductive patterns and vertical light emitting diode are formed in the upper substrate 112 and the transistor and the power supply PS for driving the light emitting diode are formed on the lower substrate 111. Thereafter, the upper substrate and the lower substrate are bonded to manufacture the display device.

That is, the light emitting diode of the display device 200 according to another exemplary embodiment of the present disclosure is not bonded by a separate process, but the display device may be manufactured by one bonding process.

Therefore, it is advantageous in that a manufacturing yield of a light emitting diode of the display device 200 may be improved.

Further, the display device according to another exemplary embodiment of the present disclosure may supply the low potential voltage through the plurality of conductive patterns and upper connection line.

Therefore, there is no need to supply the low potential voltage through the lower connection line so that the number of lower connection lines may be relatively reduced.

As a result, a number of connection lines on the lower substrate 111 is reduced so that a stretching rate of the display device may be improved.

Further, according to another exemplary embodiment of the present disclosure, the vertical light emitting diode is applied so that a number of pixels to be disposed in a unit area, as compared with the example that the horizontal light emitting diode is applied, may be increased.

Accordingly, in the display device according to another exemplary embodiment of the present disclosure, it is advantageous in that the number of pixels is increased so that the resolution is improved.

The exemplary embodiments of the present disclosure can also be described as follows:

A display device may include a lower substrate which is divided into an active area and a non-active area and is stretchable; a plurality of pixels which is disposed on the active area of the lower substrate; a power supply which is disposed on the non-active area of the lower substrate; a plurality of lower connection lines which is disposed on the lower substrate and is connected to each of the plurality of pixels; an upper substrate which is opposite to the lower substrate and is stretchable; a plurality of conductive patterns which is disposed below the upper substrate and is connected to the plurality of pixels, respectively; and a plurality of upper connection lines which is disposed below the upper substrate and is connected to the plurality of conductive patterns. The power supply is electrically connected to the plurality of pixels through a part of the plurality of upper connection lines and a part of the plurality of lower connection lines, to stably supply a voltage to the plurality of pixels.

The power supply may include a plurality of first power blocks and a plurality of second power blocks disposed on the same layer; and a plurality of third power blocks which is disposed on a different layer from the plurality of first power blocks and the plurality of second power blocks.

The plurality of first power blocks may be disposed inside from the plurality of second power blocks.

The plurality of third power blocks may be connected to the plurality of lower connection lines.

Each of the plurality of conductive patterns may include a plurality of first conductive patterns disposed in the active area; and a plurality of second conductive patterns disposed in the non-active area.

Each of the plurality of first power blocks may be connected to each of the plurality of second conductive patterns through a contact hole and each of the plurality of second power blocks may be connected to each of the plurality of third power blocks through a contact hole.

A low potential voltage may be applied to the plurality of first power blocks and the plurality of second conductive patterns and a high potential voltage may be applied to the plurality of second power blocks and the plurality of third power blocks.

Each of the plurality of first power blocks may be connected to each of the plurality of third power blocks through a contact hole and each of the plurality of second power blocks may be connected to each of the plurality of second conductive patterns through a contact hole.

A low potential voltage may be applied to the plurality of second power blocks and the plurality of second conductive patterns and a high potential voltage may be applied to the plurality of first power blocks and the plurality of third power blocks.

Each of the plurality of pixels may include a vertical light emitting diode which is electrically connected to any one of the plurality of first conductive patterns.

Only a low potential voltage may be applied to the plurality of conductive patterns.

A plurality of lower plate patterns may be formed between the lower substrate and the plurality of pixels, a plurality of lower line patterns may be formed between the lower substrate and the plurality of lower connection lines, and a modulus of elasticity of each of the plurality of lower plate patterns and the plurality of lower line patterns may be higher than a modulus of elasticity of the lower substrate.

A plurality of upper plate patterns may be formed between the upper substrate and the plurality of conductive patterns, a plurality of upper line patterns may be formed between the upper substrate and the plurality of upper connection lines, and a modulus of elasticity of each of the plurality of upper plate patterns and the plurality of upper line patterns may be higher than a modulus of elasticity of the upper substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts in the equivalent scope of the present disclosure should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a lower substrate having an active area and a non-active area, the lower substrate being stretchable;
   a plurality of pixels disposed on the active area of the lower substrate;
   a power supply disposed on the non-active area of the lower substrate;
   a plurality of lower connection lines disposed on the lower substrate and connected to each of the plurality of pixels;
   an upper substrate which is spaced from the lower substrate, the upper substrate being stretchable;
   a plurality of conductive patterns disposed between the upper substrate and the lower substrate, the plurality of conductive patterns being connected to the plurality of pixels, respectively; and
   a plurality of upper connection lines disposed between the upper substrate and the lower substrate, the plurality of upper connection lines being connected to the plurality of conductive patterns, respectively,
   wherein the power supply is electrically connected to each of the plurality of pixels through at least one of the plurality of upper connection lines and at least one of the plurality of lower connection lines.

2. The display device according to claim 1,
   wherein the power supply includes:
   a plurality of first power blocks and a plurality of second power blocks disposed on the same layer; and
   a plurality of third power blocks which is disposed on a different layer from the plurality of first power blocks and the plurality of second power blocks.

3. The display device according to claim 2,
   wherein the plurality of first power blocks is disposed inside from the plurality of second power blocks.

4. The display device according to claim 2,
   wherein the plurality of third power blocks is connected to the plurality of lower connection lines.

5. The display device according to claim 1,
   wherein each of the plurality of conductive patterns includes:
   a plurality of first conductive patterns disposed in the active area; and
   a plurality of second conductive patterns disposed in the non-active area.

6. The display device according to claim 5,
   wherein each of the plurality of first power blocks is connected to each of the plurality of second conductive patterns through a contact hole in a layer between the plurality of first power blocks and the plurality of second conductive patterns and each of the plurality of second power blocks is connected to each of the plurality of third power blocks through a contact hole in a layer between the plurality of second power blocks and the plurality of third power blocks.

7. The display device according to claim 6,
wherein a low potential voltage is applied to the plurality of first power blocks and the plurality of second conductive patterns and a high potential voltage is applied to the plurality of second power blocks and the plurality of third power blocks.

8. The display device according to claim 5,
wherein each of the plurality of first power blocks is connected to each of the plurality of third power blocks through a contact hole in a layer between the plurality of first power blocks and the plurality of third power blocks and each of the plurality of second power blocks is connected to each of the plurality of second conductive patterns through a contact hole in a layer between the plurality of second power blocks and the plurality of second conductive patterns.

9. The display device according to claim 8,
wherein a low potential voltage is applied to the plurality of second power blocks and the plurality of second conductive patterns and a high potential voltage is applied to the plurality of first power blocks and the plurality of third power blocks.

10. The display device according to claim 5,
wherein each of the plurality of pixels includes a vertical light emitting diode which is electrically connected to any one of the plurality of first conductive patterns.

11. The display device according to claim 1,
wherein only a low potential voltage is applied to the plurality of conductive patterns.

12. The display device according to claim 1,
wherein a plurality of lower plate patterns is formed between the lower substrate and the plurality of pixels,
a plurality of lower line patterns is formed between the lower substrate and the plurality of lower connection lines and is connected to the plurality of lower plate patterns, and
a modulus of elasticity of each of the plurality of lower plate patterns and the plurality of lower line patterns is higher than a modulus of elasticity of the lower substrate.

13. The display device according to claim 1,
wherein a plurality of upper plate patterns is formed between the upper substrate and the plurality of conductive patterns,
a plurality of upper line patterns is formed between the upper substrate and the plurality of upper connection lines is connected to the plurality of upper plate patterns, and
a modulus of elasticity of each of the plurality of upper plate patterns and the plurality of upper line patterns is higher than a modulus of elasticity of the upper substrate.

14. A display device, comprising:
a lower substrate having an active area and a non-active area, the lower substrate being stretchable;
a plurality of drive transistors disposed on the active area of the lower substrate;
a plurality of switching transistors disposed on the active area of the lower substrate, respective ones of the plurality of switching transistors being connected to respective ones of the drive transistors;
a power supply disposed on the non-active area of the lower substrate;
a plurality of lower connection lines disposed on the lower substrate and connected to respective ones of each of the plurality of switching transistors;
an upper substrate which is spaced from the lower substrate, the upper substrate being stretchable;
a plurality of conductive patterns disposed adjacent to the upper substrate;
a plurality of light emitting diodes (LEDs) electrically connected to respective conductive patterns;
a plurality of upper connection lines disposed between the upper substrate and the LEDs to electrically connect respective ones of the LEDs to the conductive patterns;
wherein the power supply is configured to be electrically connected to each of the plurality of LEDs through the drive transistors based on signals from the switching transistors.

15. The display device of claim 14 wherein the plurality of conductive patterns are between the upper substrate and the lower substrate.

16. The display device of claim 14 wherein a single LED, a single drive transistor and a first plurality of switching transistors are electrically connected to each other to form a single subpixel.

17. The display device of claim 14 further including a plurality of lower plate patterns are disposed on the lower substrate, each lower plate pattern of the plurality having three subpixels thereon to form a single pixel on the lower plate pattern.

18. The display device of claim 17 further including a plurality of inorganic insulating layers over the lower plate pattern, a bank layer over the plurality of inorganic insulation layers and an opening in the bank layer.

19. The display device of claim 18 in which the entire LED is positioned in the opening of the bank layer.

* * * * *